(12) United States Patent
Umeda et al.

(10) Patent No.: US 6,215,146 B1
(45) Date of Patent: Apr. 10, 2001

(54) SEMICONDUCTOR DEVICE AND MANUFACTURING METHOD THEREOF

(75) Inventors: Hiroshi Umeda; Tamotsu Ogata; Hiroshi Kurokawa; Hiroaki Tamura, all of Hyogo (JP)

(73) Assignee: Mitsubishi Kenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/090,420

(22) Filed: Jun. 4, 1998

(30) Foreign Application Priority Data

Jan. 14, 1998 (JP) .................................................. 10-005931

(51) Int. Cl.[7] .................................................. H01L 29/788
(52) U.S. Cl. ........................................... 257/315; 257/411
(58) Field of Search ..................................... 257/411, 315

(56) References Cited

U.S. PATENT DOCUMENTS

| 5,237,188 | 8/1993 | Iwai et al. ............................. 257/325 |
| 5,874,766 | * 2/1999 | Hori ....................................... 257/411 |
| 5,939,763 | * 8/1999 | Hao et al. .............................. 257/411 |

FOREIGN PATENT DOCUMENTS 7-28041    3/1995   (JP) .

OTHER PUBLICATIONS

"High Reliability of Nanometer–Range $N_2O$–Nitrated Oxides Due to Suppressing Hole Injection", K. Kobayashi et al., IEDM 96, pp. 335–338, Dec. 1996.

"Growth and surface chemistry of oxynitride gate dielectric using nitric oxide", Rama I. Hedge, et al., Appl. Phys. Lett. 66(21), May 22, 1995, pp. 2882–2884.

* cited by examiner

Primary Examiner—Mark V. Prenty
(74) Attorney, Agent, or Firm—McDermott, Will & Emery

(57) ABSTRACT

An object is to provide a semiconductor device having high reliability and capable of high speed operation. The semiconductor device includes a silicon substrate, a silicon nitrided oxide film formed on the silicon substrate, and a gate electrode formed on the silicon nitrided oxide film. Nitrogen is distributed only in the vicinity of an interface between the silicon substrate and the silicon nitrided oxide film. In the vicinity of the interface, every nitrogen atom is bonded to two silicon atoms and one oxygen atom.

4 Claims, 26 Drawing Sheets

SEMICONDUCTOR DEVICE AND MANUFACTURING METHOD THEREOF

BACKGROUND OF THE INVENTION

1. Field of the Invention

The present invention relates to a semiconductor device and manufacturing method thereof. More specifically, the present invention relates to a semiconductor device and manufacturing method thereof in which a nitrided oxide film is used as a gate insulating film.

2. Description of the Background Art

Demand of semiconductor devices has been rapidly increasing along with remarkable spread of information equipment such as computers. As for the function, devices having large storage capacity and capable of high speed operation are in demand. Accordingly, technical efforts have been made to realize higher degree of integration, higher speed of response and higher reliability of the semiconductor devices.

A DRAM (Dynamic Random Access memory) has been generally known as one of the semiconductor devices that allows random input/output of memory information. The DRAM includes a memory cell array as a storage region storing a number of pieces of memory information, and peripheral circuitry necessary for external input/output.

The memory cell array is formed by a plurality of memory cells each storing a unit memory information arranged in a matrix of rows and columns. The memory cell generally includes one MOS transistor.

FIG. 45 is a cross section of an MOS transistor used in a conventional DRAM. Referring to FIG. 45, n type source·drain regions 202a and 202b are formed in a p type silicon substrate 201. A region between the source·drain regions 202a and 202b is a p type channel region 201a. A gate electrode 204 is formed on channel region 201a with a gate insulating film 203 formed of a silicon oxide interposed.

When the MOS transistor structured in this manner is operated, a voltage is applied to gate electrode 204. Then, channel region 201a is inverted to n type, and therefore current flows through the source·drain regions 202a and 202b.

When the size of the MOS transistor is reduced, thickness of gate insulating film 203 is reduced, and the distance between the source·drain regions 202a and 202b is also reduced. Even in that case, the voltage applied to gate electrode 204 and the voltage applied to source·drain regions 202a and 202b are not much different from those used conventionally. Therefore, when miniaturized, electric field in the longitudinal direction of channel 201a (longitudinal direction of FIG. 45) becomes higher. This lowers effective mobility $\mu_{eff}$ of electrons in channel region 201a, degrading drivability of the transistor.

Further, since electric field in the lateral direction of the channel region 201a (direction from source·drain region 202a to source·drain region 202b) becomes higher, and carriers (electrons) are accelerated, promoting entrance of carriers into gate insulating film 203. This undesirably makes shorter the hot carrier life of the transistor.

Further, since gate insulating film 203 is made thinner, electric field attains higher also in gate insulating film 203. Accordingly, insulation of gate insulating film is degraded, resulting in sharp lowering of dielectric breakdown life $T_{bd}$ against TDDB (Time Dependent Dielectric Breakdown) of the transistor.

In order to solve these problems, a transistor using a silicon nitrided oxide as the gate insulating film has been proposed in Japanese Patent Publication No. 7-28041. FIG. 46 is a cross section of the transistor using a silicon nitrided oxide as the gate insulating film. In the transistor shown in FIG. 45, silicon oxide was used for the gate insulating film, while in the transistor shown in FIG. 46, silicon nitrided oxide 103 is used as the gate insulating film.

Other than this point, an element isolating insulating film 104 is formed on a silicon substrate 101, and an interlayer insulating film 107 is formed on element isolating insulating film 104. Source·drain regions 106 are formed at the surface of silicon substrate, and a gate electrode 105 is formed with silicon nitrided oxide 103 interposed, on the surface of silicon substrate 101. An interlayer insulating film 107 is formed to cover gate electrode 105, and an aluminum electrode 108 reaching source·drain regions 106 is formed on interlayer insulating film 107.

In the semiconductor device structured as described above, effective mobility $\mu_{eff}$ of electrons is improved. However, the problems of degraded hot carrier life and dielectric breakdown life are not solved.

U.S. Pat. No. 5,237,188 also discloses a transistor utilizing a nitrided oxide as the gate insulating film. However, this transistor does not solve the problems of degraded hot carrier life and dielectric breakdown life, either.

SUMMARY OF THE INVENTION

Therefore, the invention was made to solve the above described problems and its object is to provide a semiconductor device having high reliability and capable of high speed operation, having superior characteristics of effective mobility $\mu_{eff}$, hot carrier life and dielectric breakdown life.

The inventors made various experiments to improve effective mobility, hot carrier life and dielectric breakdown life, and reached the following conclusion.

(1) In order to improve effective mobility, it is necessary to adapt silicon nitrided oxide (SiON) as the gate insulating film.

(2) The silicon nitrided oxide film is formed by nitriding a silicon oxide formed by thermal oxidation. Thermal oxidation includes dry oxidation using dry oxygen and wet oxidation using steam. When oxidation is performed at the same temperature, longer dielectric breakdown life is obtained by nitriding the silicon oxide formed by wet oxidation.

(3) In order to improve dielectric breakdown life and hot carrier life, distribution of nitrogen in the silicon nitrided oxide and state of bonding of nitrogen must be optimized.

Based on these findings, the semiconductor device of the present invention includes a silicon substrate, silicon nitrided oxide film formed on the silicon substrate, and a gate electrode formed on the silicon nitrided oxide film. Nitrogen is distributed only in the vicinity of an interface between the silicon substrate and the silicon nitrided oxide film. Near the interface, all nitrogen atoms are bonded to two silicon atoms and one oxygen atom. This bonding is represented by the following chemical formula.

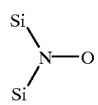

In such a semiconductor device, effective mobility is improved as the silicon nitrided oxide film is used as the gate insulating film. Further, since distribution of nitrogen and state of bonding of nitrogen atoms are optimized, the dielectric breakdown life and the hot carrier life are improved. As a result, a semiconductor device having highly reliability and capable of high speed operation can be provided.

It is preferred that the gate electrode is a floating gate electrode, and that the semiconductor device further includes a control gate electrode formed on the floating gate electrode with a dielectric film interposed. In that case, a non-volatile semiconductor memory device having high reliability and capable of high speed operation can be provided.

According to another aspect of the present invention, the semiconductor device includes a silicon substrate, a silicon nitrided oxide film formed on the silicon substrate, and a gate electrode formed on the silicon nitrided oxide film. Nitrogen is distributed only in the vicinity of an interface between the silicon substrate and the silicon nitrided oxide film. A nitrogen atom bonded to three silicon atoms exist only near the interface and preferably, it exist only at a portion very close to the interface, that is, a portion where the silicon nitrided oxide film is next to the interface. The bonding is expressed by the following chemical formula.

(2)

In such a semiconductor device, effective mobility is improved as the silicon nitrided oxide film is used as the gate insulating film. Further, since distribution of nitrogen and the state of bonding of nitrogen atoms are optimized, the dielectric breakdown life and the hot carrier life can be improved. As a result, a semiconductor device having high reliability and capable of high speed operation can be provided.

It is preferred that the gate electrode is a floating gate electrode and that the semiconductor device further includes a control gate electrode formed on the floating gate electrode with a dielectric film interposed. In that case, a non-volatile semiconductor memory device having high reliability and capable of high speed operation can be provided.

According to one aspect of the present invention, the method of manufacturing a semiconductor device includes the steps of forming a silicon oxide film on a silicon substrate, forming a silicon nitrided oxide film by nitriding the silicon oxide film, and forming a gate electrode on the silicon nitride oxide film. The step of forming the silicon oxide film includes forming a silicon oxide film by oxidizing in a steam atmosphere. The step of forming a silicon nitrided oxide film includes the step of keeping the silicon oxide film in an atmosphere of dinitrogen oxide ($N_2O$) at a temperature of 800° C. to 900° C. for at least 5 minutes and at most 60 minutes.

According to the method of manufacturing a semiconductor device as described above, a silicon nitrided oxide film is formed as a gate insulating film improving effective mobility. The silicon nitrided oxide film is obtained by nitriding a silicon oxide film formed in a steam atmosphere, and therefore the dielectric breakdown life can be improved. Further, nitriding is performed by keeping the silicon oxide film in an atmosphere of dinitrogen oxide at a temperature of 800° C. to 900° C. for at least 5 minutes and at most 60 minutes, nitrogen is distributed only in the vicinity of the interface, and every nitrogen atom is bonded to two silicon atoms and one oxygen atom. Therefore, distribution and the state of bonding of nitrogen are optimized, so that a gate insulating film ensuring improved dielectric breakdown life and hot carrier life can be formed. As a result, a semiconductor device having high reliability and capable of high speed operation can be manufactured.

In the step of forming the silicon nitrided oxide film, the temperature is set to be at least 800° C. When the temperature is lower than 800° C., nitriding process does not proceed sufficiently, failing to provide the silicon nitrided oxide film. The upper limit of the temperature is 900° C. When the temperature exceeds 900° C., the nitrogen atom comes to be bonded to three silicon atoms.

The silicon oxide film is kept from 5 to 60 minutes in the atmosphere of dinitrogen oxide, as nitriding process does not proceed sufficiently if the time is shorter than 5 minutes and the nitriding rate is saturated when the time exceeds 60 minutes.

In the step of forming the silicon nitrided oxide film, it is preferred that a silicon nitrided oxide film having the thickness of at most 1.16 times that of silicon oxide film is formed.

According to another aspect, the method of manufacturing a semiconductor device includes the steps of forming a silicon oxide film on a silicon substrate, forming a silicon nitrided oxide film by nitriding the silicon oxide film, and forming a gate electrode on the silicon nitrided oxide film. The step of forming the silicon oxide film includes forming a silicon oxide film by oxidizing in an atmosphere of steam. The step of forming the silicon nitrided oxide film includes the step of keeping the silicon oxide film in an atmosphere of nitrogen oxide (NO) at a temperature of 800° C. to 900° C. for at least 5 minutes and at most 60 minutes.

In the method of manufacturing a semiconductor device as described above, the silicon nitrided oxide film is formed as a gate insulating film improving effective mobility. The silicon nitrided oxide film is obtained by nitriding a silicon oxide film formed in a steam atmosphere, and hence the dielectric breakdown life is improved. Further, nitriding is performed by keeping the silicon oxide film in an atmosphere of nitrogen oxide at a temperature of 800° C. to 900° C. for at least 5 minutes and at most 60 minutes, and therefore nitrogen is distributed only in the vicinity of the interface between the silicon substrate and the silicon nitrided oxide film, and nitrogen atoms each bonded to three silicon atoms exist only in the vicinity of the interface. Therefore, distribution and the state of bonding of nitrogen are optimized, so that the dielectric breakdown life and hot carrier life are improved. As a result, a semiconductor device having high reliability and capable of high speed operation can be provided.

In the step of forming the silicon nitrided oxide film, the temperature is set to be at least 800° C. If the temperature is lower than 800° C., nitriding process does not proceed sufficiently, failing to provide a silicon nitrided oxide film. Further, the temperature is set to be at most 900° C. When the temperature exceeds 900° C., there would be nitrogen atoms each bonded to three silicon atoms entirely in the silicon nitrided oxide film.

Further, the silicon oxide film should be kept in the nitrogen oxide atmosphere for at least 5 minutes and at most 60 minutes. When the time is shorter than 5 minutes, nitriding process does not proceed sufficiently, failing to provide a silicon nitrided oxide film. When the time exceeds 60 minutes, the rate of nitriding is saturated.

Further, in the step of forming the silicon nitrided oxide film, it is preferred that the silicon nitrided oxide film having the thickness of at most 1.16 times that of the silicon oxide film is formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

(FIRST EMBODIMENT)

Manufacturing of a Transistor

Figure 1:
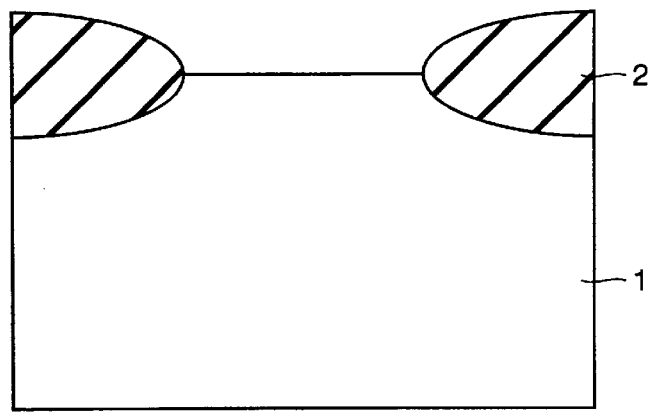
FIGS. 1 to 3 are cross sections showing the first to third steps of manufacturing the semiconductor device in accordance with a first embodiment.

Referring to FIG. 1, an isolating insulating film 2 was formed on a p type silicon substrate 1 by LOCOS (Local Oxidation of Silicon) method.

Figure 2:
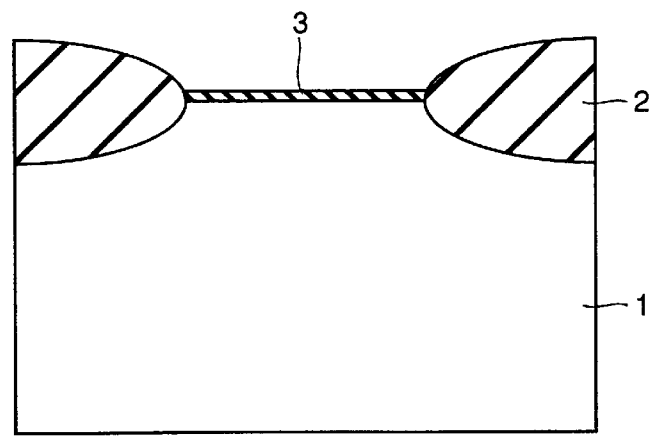

Referring to FIG. 2, silicon substrate 1 was put in a batch type furnace heated by a heater. The temperature of the furnace was kept at about 750° C., volume flow rate of hydrogen and oxygen was set to the ratio of 1:10 to 2:1, and hydrogen and oxygen were reacted to generate steam. In this vapor, a surface of silicon substrate 1 is oxidized to form a silicon oxide film (pyrogenic oxidation).

Thereafter, a mixed gas with the ratio of volume flow rate being 5:95 of dinitrogen oxide ($N_2O$) and nitrogen ($N_2$) was introduced to the furnace, the temperature of the furnace was set to 800° C., and this state was kept for 20 minutes, so that the silicon oxide film was nitrided to a nitrided oxide film 3.

Figure 3:
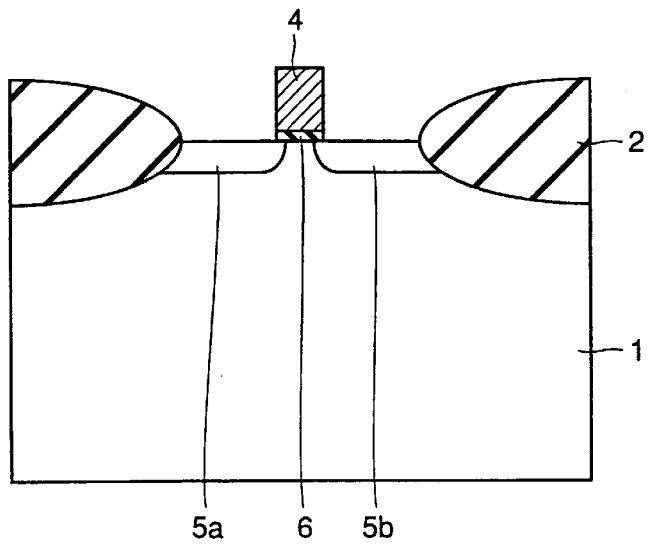

Doped polysilicon was deposited to cover nitrided oxide film 3, and the doped polysilicon and nitrided oxide film 3 were patterned to a prescribed shape, whereby a gate electrode 4 and a gate insulating film 6 having the thickness of 7.5 nm were formed as shown in FIG. 3. By implanting phosphorus to silicon substrate 1, source-drain regions 5a and 5b are formed.

In this manner, field effect transistors of Sample 1 were manufactured.

Measurement of Effective Mobility $\mu_{eff}$ of Electrons

Figure 4:
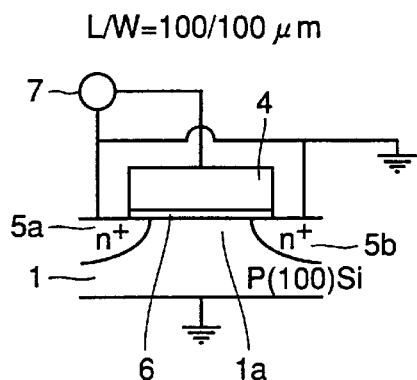
FIGS. 4 and 5 show first and second steps for measuring mobility of electrons.

Referring to FIG. 4, gate length L and gate width W of the transistor manufactured in the above described steps were both set to 100 $\mu$m. Silicon substrate 1 was set to the ground potential. A CV meter 7 for measuring capacitance was connected to gate electrode 4 and source-drain region 5a. Source-drain regions 5a and 5b were also set to the ground potential. In this state, a voltage applied to gate electrode 4 was varied from −0.5V to 5V, and capacitance $C_{gc}$ between gate electrode 4 and channel region 1a was measured.

Figure 5:
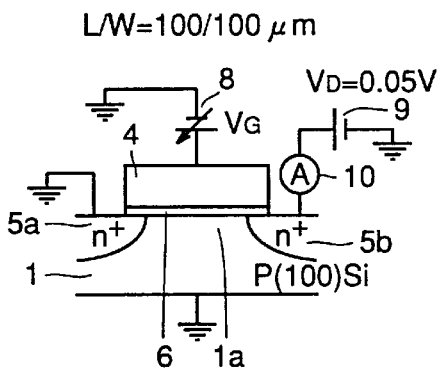
Figure 6:
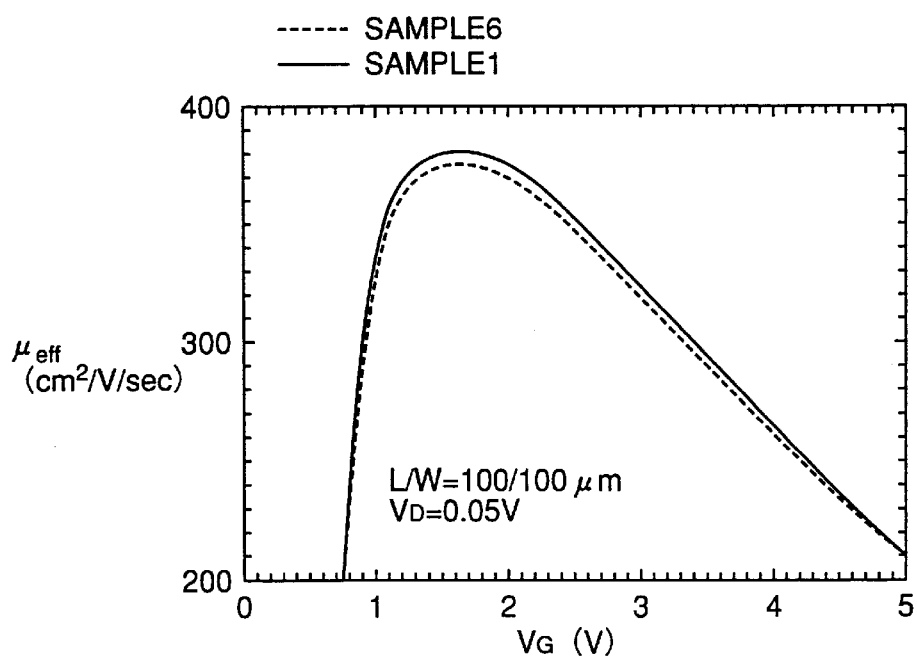
FIGS. 6 to 10 are graphs showing relation between the gate voltage and mobility of electrons of Samples 1 to 5 in comparison with Sample 6.
Figure 7:
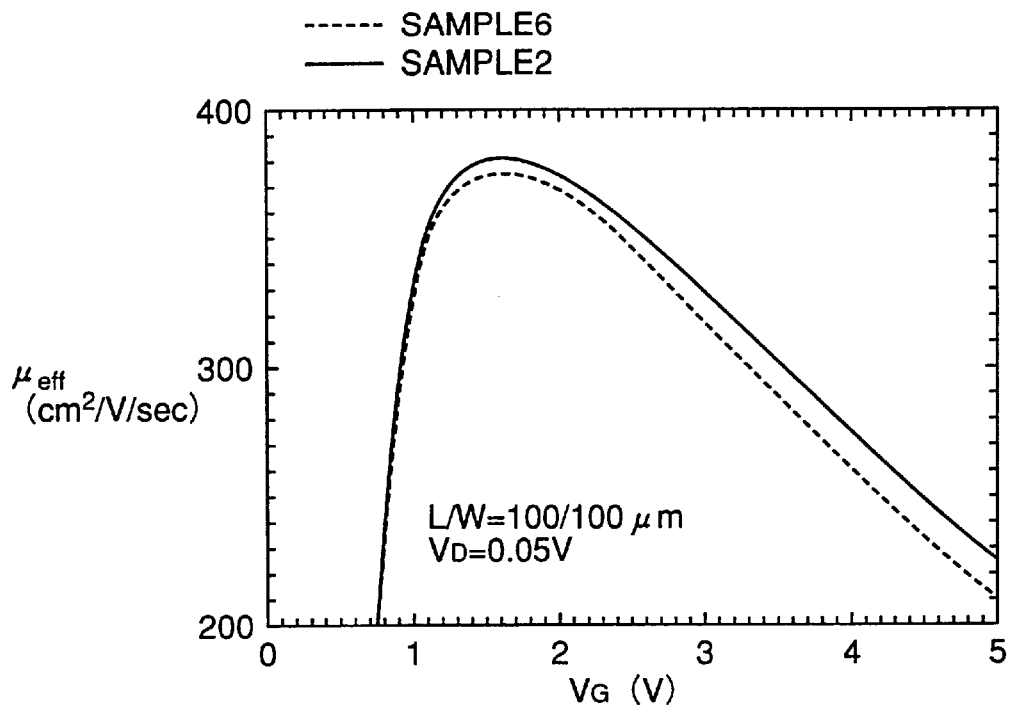
Figure 8:
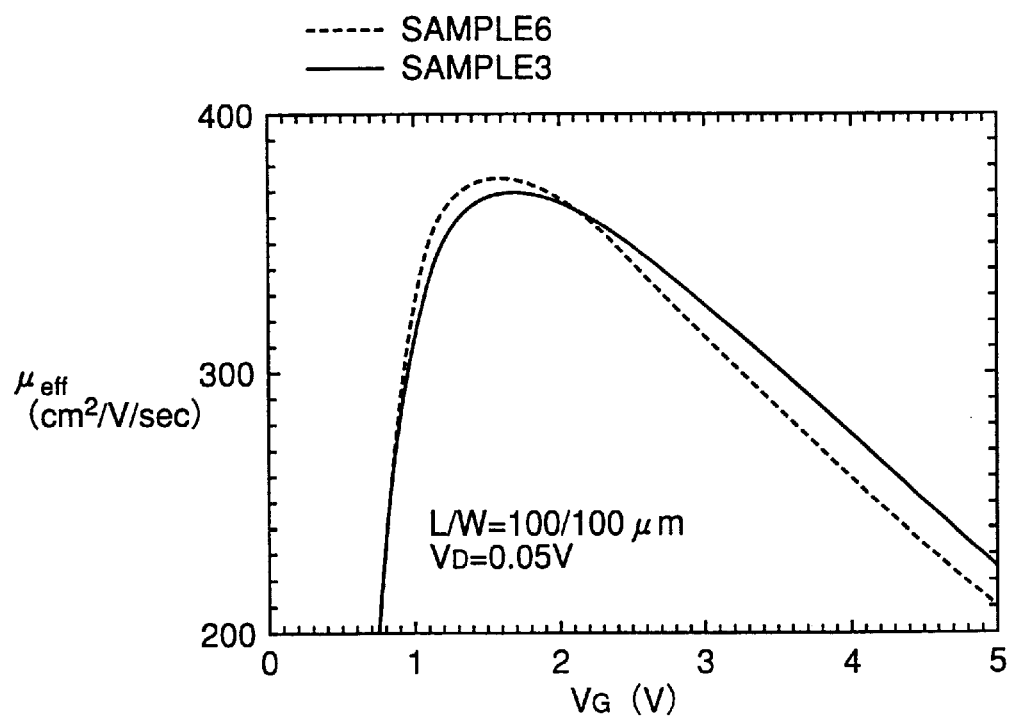
Figure 9:
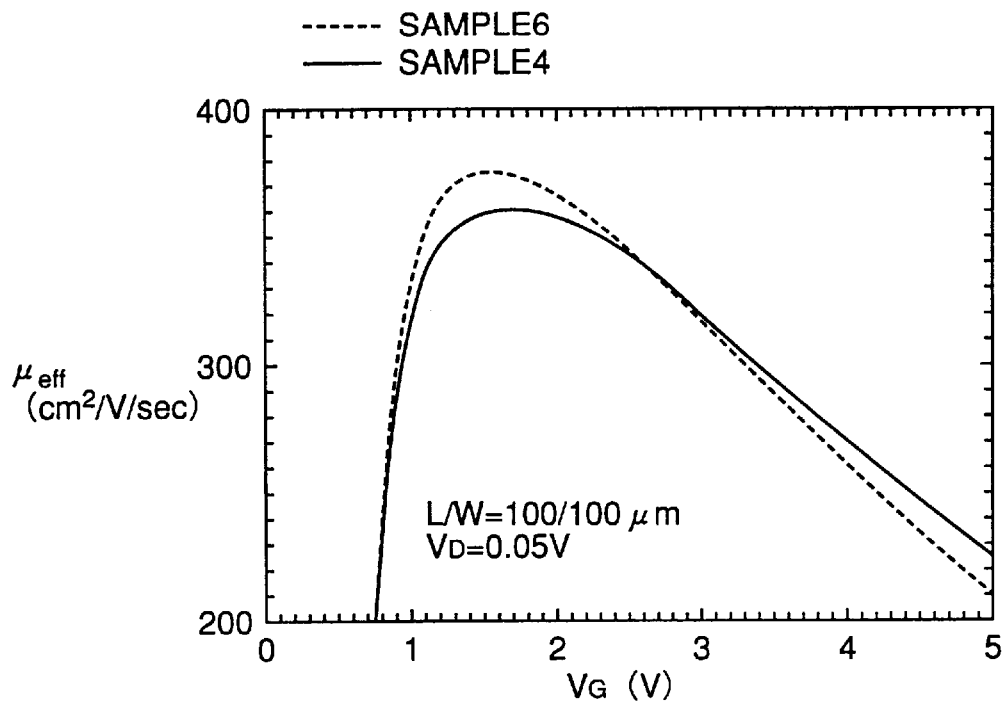
Figure 10:
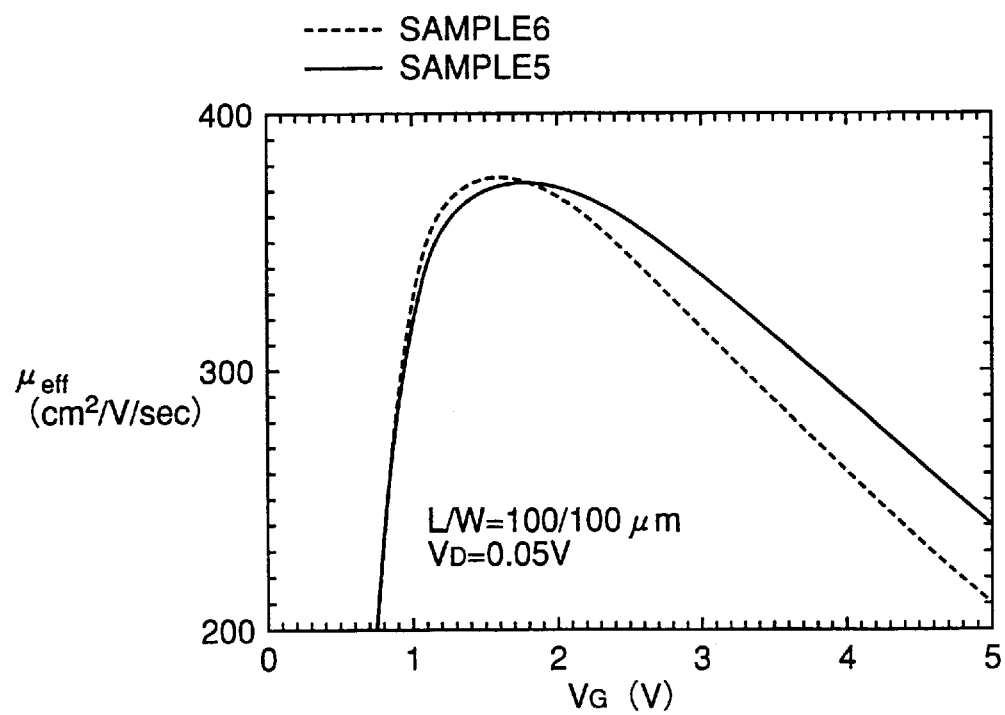

Referring to FIG. 5, after completion of measurement of capacitance $C_{gc}$, gate electrode 4 was connected to a variable gate power supply 8, and source-drain region 5a and silicon substrate 1 were set to the ground potential. By connecting source-drain 5b to an ampere meter 10 and to a drain power supply 9 having the voltage of 0.05V, potential of source-drain region 5V was set to 0.05V.

In this state, a voltage $V_G$ applied to gate electrode 4 was varied, while a current $I_D$ flowing between source-drain regions 5a and 5b was measured. The results were put in the equation below, and current density $Q_N$ ($V_G$) in channel region 1a was calculated.

$$Q_N(V_G) = \int_{-0.5}^{V_G} C_{gc}(V_{G'})dV_{G'} \qquad (3)$$

Thereafter, the results of experiments described above and the value $Q_N$ ($V_G$) were substituted in the following equation, and effective mobility $\mu_{eff}$ of electrons in channel region 1a was calculated.

$$\mu_{eff}=(L/W) \cdot (1/Q_N(V_G)) \cdot (I_D/V_D) \qquad (4)$$

Further, Samples 2 to 6 of field effect transistors having various gate insulating films were manufactured by setting the ratio of volume flow rate of $N_2O$ and $N_2$ and the temperature for nitriding set variously as shown below, in the step shown in FIG. 2.

TABLE 1

| Sample No. | Ratio of Volume Flow Rate Proportion of $N_2O$ and $N_2$ at the time of Nitriding | Time of Nitriding (min) | Temperature of Nitriding (° C.) | Marks in Figures |
|---|---|---|---|---|
| 1 | 5:95 | 20 | 800 | ○ |
| 2 | 5:95 | 20 | 850 | ◇ |
| 3 | 20:80 | 20 | 850 | □ |
| 4 | 100:0 | 20 | 850 | △ |
| 5 | 5:95 | 20 | 900 | ▽ |
| 6 | Thermal Oxide Film (Not nitrided) | | | ● |

Mobility $\mu_{eff}$ of electrons in channel region 1a of each of Samples 2 to 6 was also measured in accordance with the method shown in FIGS. 4 and 5.

Referring to FIGS. 6 to 10, it can be seen that mobility $\mu_{eff}$ of each of Samples 1 to 5 is larger than that of Sample 6, by $0 \text{ V} \leq V_G \leq 5 \text{ V}$ in Sample 1, $0 \text{ V} \leq V_G \leq 5 \text{ V}$ in Sample 2, $2.2 \text{ V} \leq V_G \leq 5 \text{ V}$ in Sample 3, $2.7 \text{ V} \leq V_G \leq 5 \text{ V}$ in Sample 4 and $1.7 \text{ V} \leq V_G \leq 5 \text{ V}$ in Sample 5. Therefore, if the gate voltage is set within such range, a field effect transistor can be provided as a semiconductor device capable of high speed operation, using Samples 1 to 5.

Measurement of Hot Carrier Life

Figure 11:
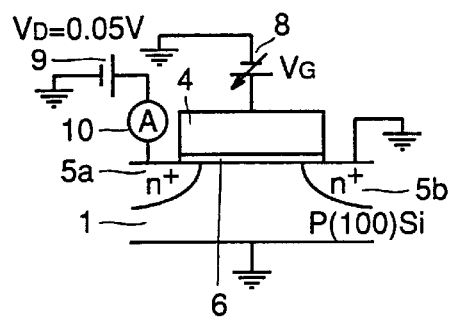
FIGS. 11 and 12 shows first and second steps for measuring the hot carrier life.

Referring to FIG. 11, in measuring effective mobility $\mu_{eff}$ of electrons, transistors having the gate length L of 100 μm and the gate width W of 100 μm were manufactured, while field effect transistors of Samples 1 to 6 having the gate length L of 0.5 μm and gate width W of 5 μm were manufactured for measuring hot carrier life.

Silicon substrate 1 and source·drain region 5b were set to the ground potential. Source·drain region 5a, ampere meter 10 and drain power supply 9 having the voltage of 0.05V were connected. In this manner, the potential of source·drain region 5a was set to 0.05V. Gate electrode 4 was connected to variable gate power supply 8.

In this state, initial threshold voltage $VTH_0$ was calculated for transistors of Samples 1 to 6 with the voltage applied to gate electrode 4 varied.

Figure 12:
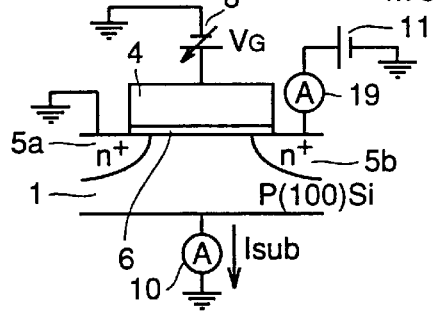
Figure 13:
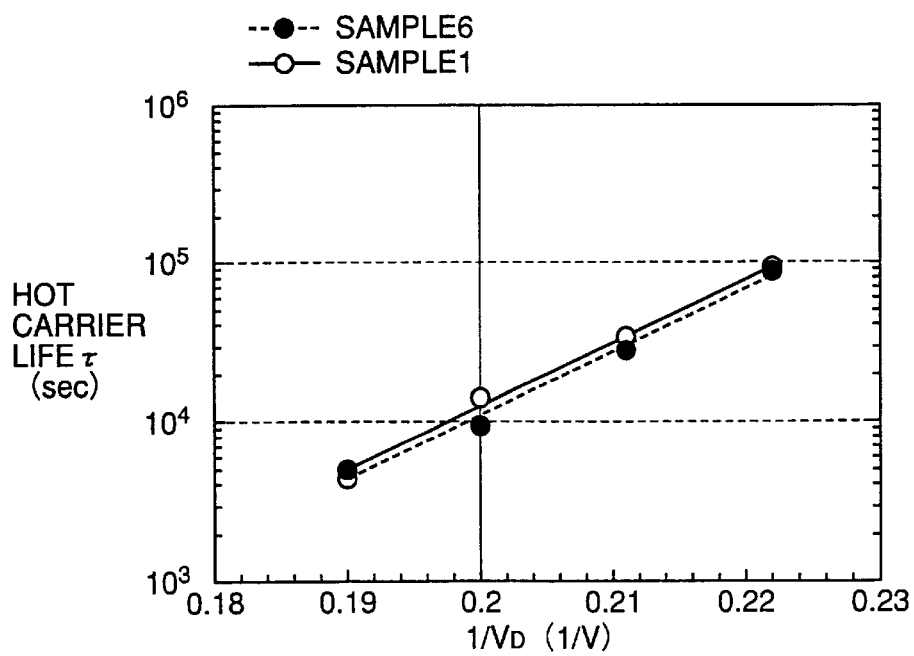
FIGS. 13 to 17 are graphs showing relation between drain voltage and hot carrier life of samples 1 to 5 in comparison with Sample 6.
Figure 14:
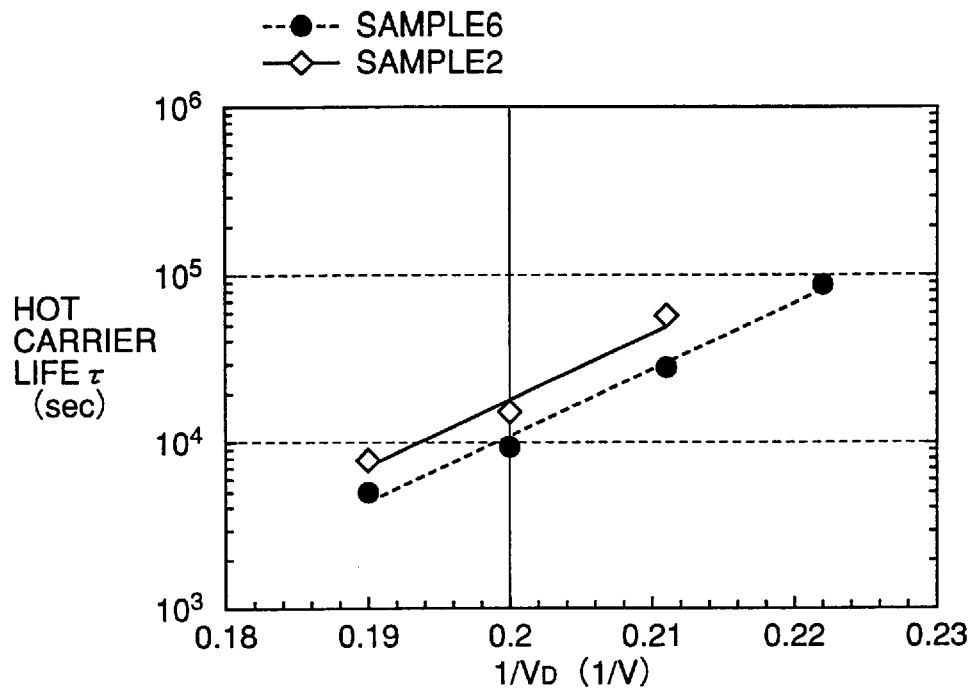
Figure 15:
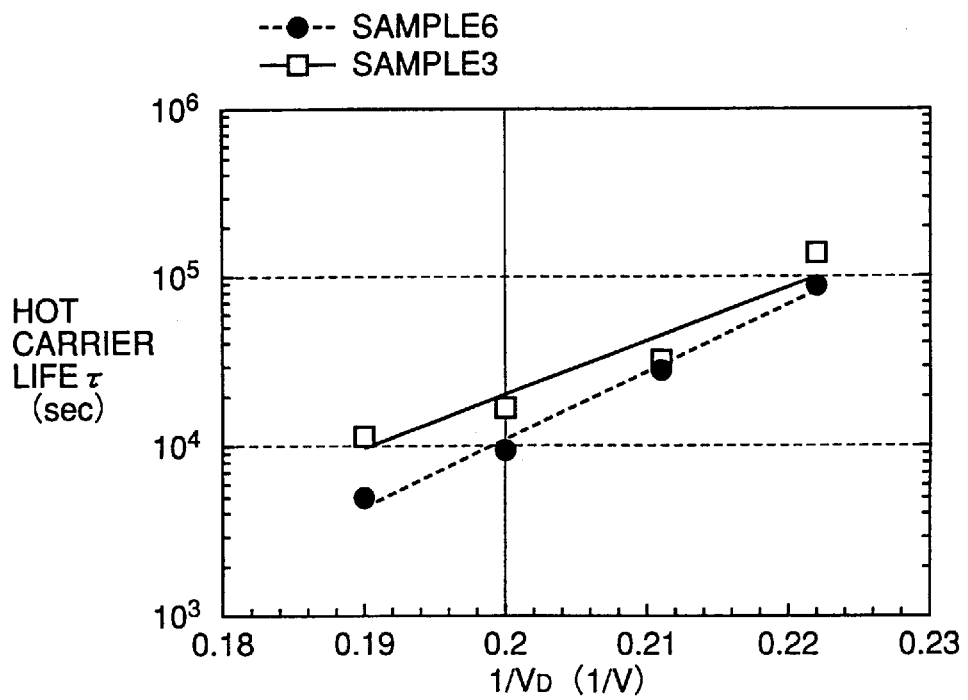
Figure 16:
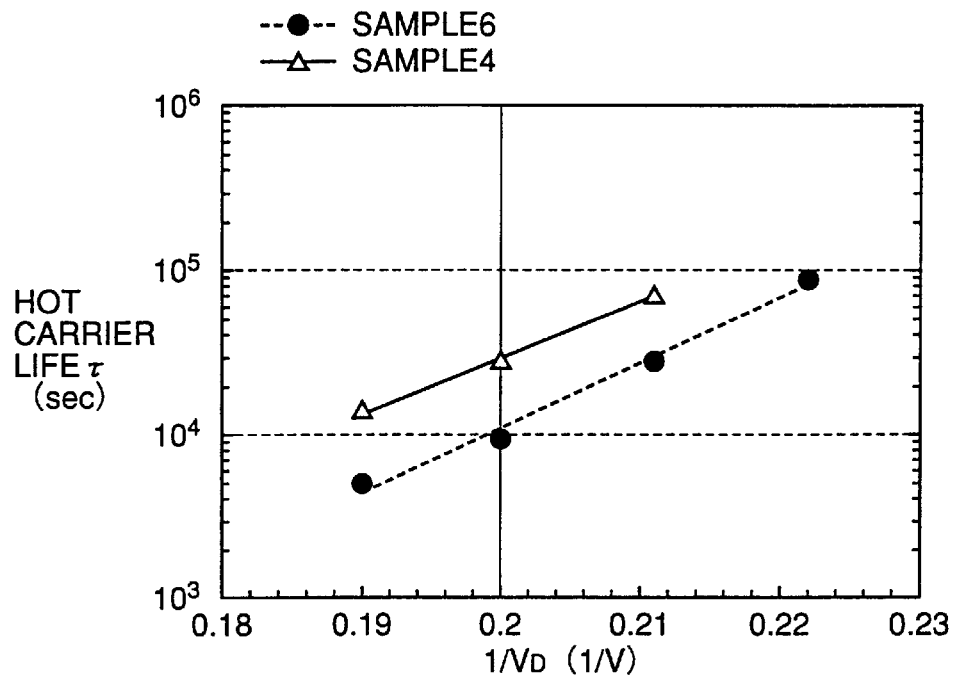
Figure 17:
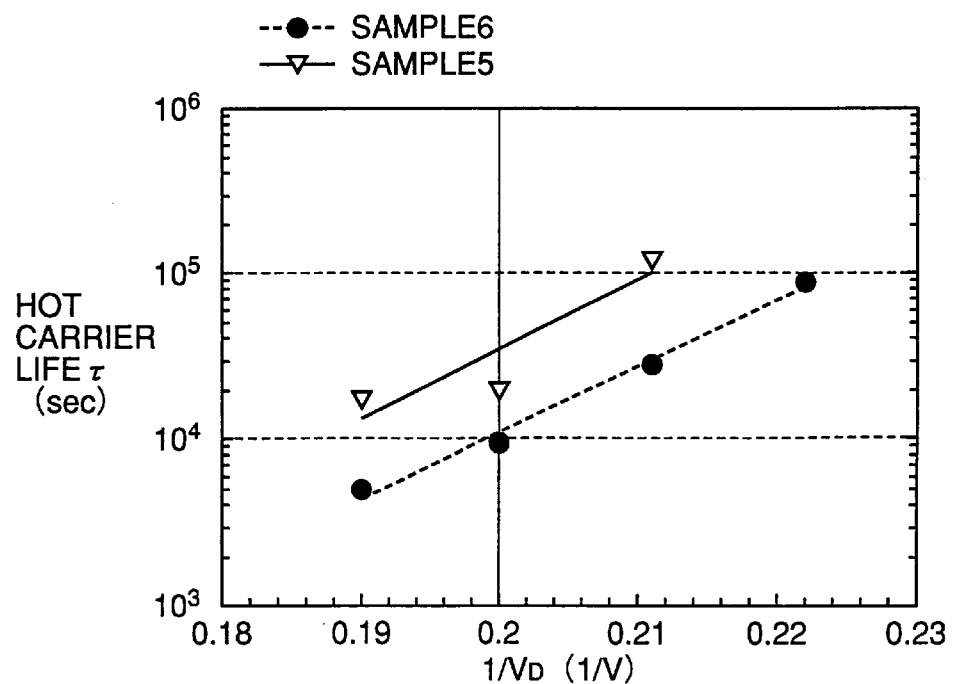

Referring to FIG. 12, silicon substrate 1 was set to the ground potential, and ampere meter 10 was connected between silicon substrate 1 and ground power supply. Source·drain region 5a was set to the ground potential. Source·drain region 5b, ampere meter 10 and variable drain power supply 11 were connected. Gate electrode 4 was connected to variable gate power supply 8.

Drain voltage $V_D$ of variable drain power supply 11 was set to 5.25V. A voltage is applied to gate electrode 4 such that the value of a current $I_{sub}$ flowing through ampere meter 10 attains maximum. This state was maintained for "a" seconds, and electric stress is applied to gate insulating film 6. Thereafter, threshold voltage VTH was again calculated for transistors of Samples 1 to 6 in the arrangement shown in FIG. 11. If the threshold voltage VTH was changed by more than 10 mV from the initial threshold voltage $VTH_0$, then the period of "a" seconds was considered the hot carrier life. If the threshold voltage VTH was not changed by more than 10 mV from the initial threshold value $VTH_0$, electrical stress is again applied for a seconds to gate insulating film 6 by the method shown in FIG. 12, and thereafter, the threshold voltage VTH was measured by the method shown in FIG. 11.

By repeating these steps, the time until the threshold voltage VTH after the application of electrical stress changed by more than 10 mV from the initial threshold voltage $VTH_0$ was measured, and the time period was considered the hot carrier life. Such measurement was performed with the drain voltage $V_D$ of 5.25 V, 5.00 V, 4.75 V and 4.50 V, respectively.

From FIGS. 13 to 17, it is noted that the hot carrier life of the transistors (Samples 1 to 5) manufactured in accordance with the present invention was compared to or larger by at most 5 times than the hot carrier life of the transistor (Sample 6) using a conventional thermal oxide film as the gate insulating film. Therefore, when the gate insulating film manufactured in accordance with the present invention is used, the life of the field effect transistor as a semiconductor device can be made longer by at most 5 times.

Figure 18:
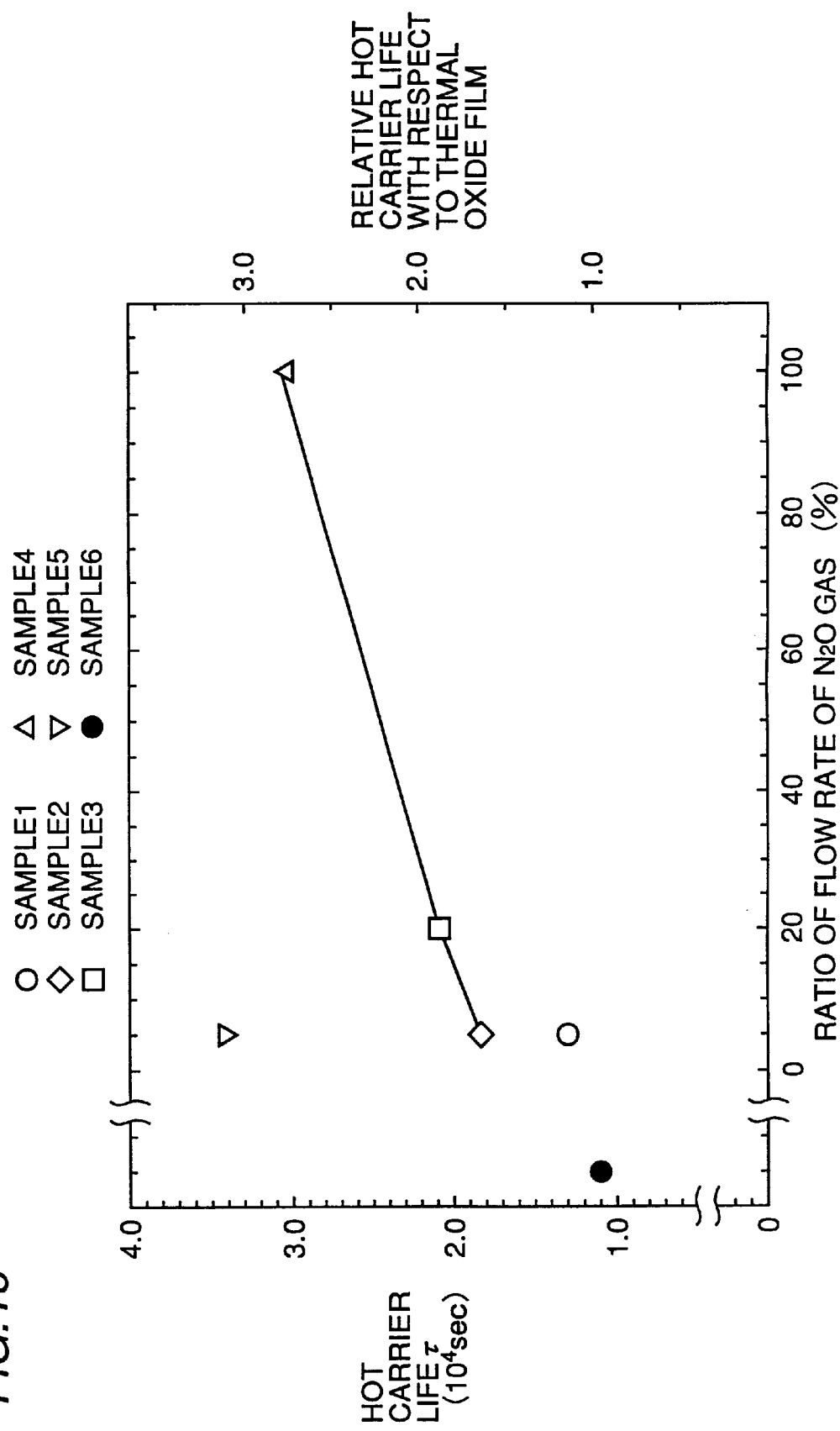
FIG. 18 is a graph showing relation between the hot carrier life and flow rate of $N_2O$ gas.

Referring to FIG. 18, it can be understood that the larger the ratio of flow rate of $N_2O$ gas, the longer the hot carrier life τ. Furthermore, it is noted that hot carrier life τ of Sample 5 in which the gate insulating film was manufactured at a high temperature (900° C.) is the longest.

Figure 19:
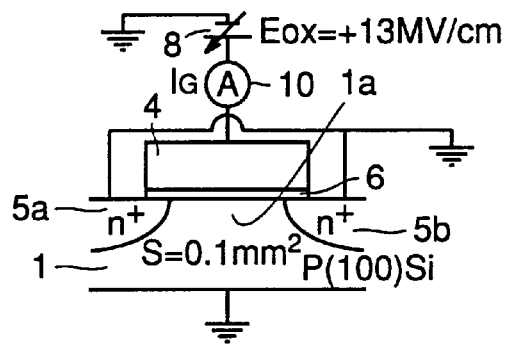
FIGS. 19 and 25 are illustrations related to a method of measuring TDDB (Time Dependent Dielectric Breakdown) characteristic at a constant voltage.
Figure 20:
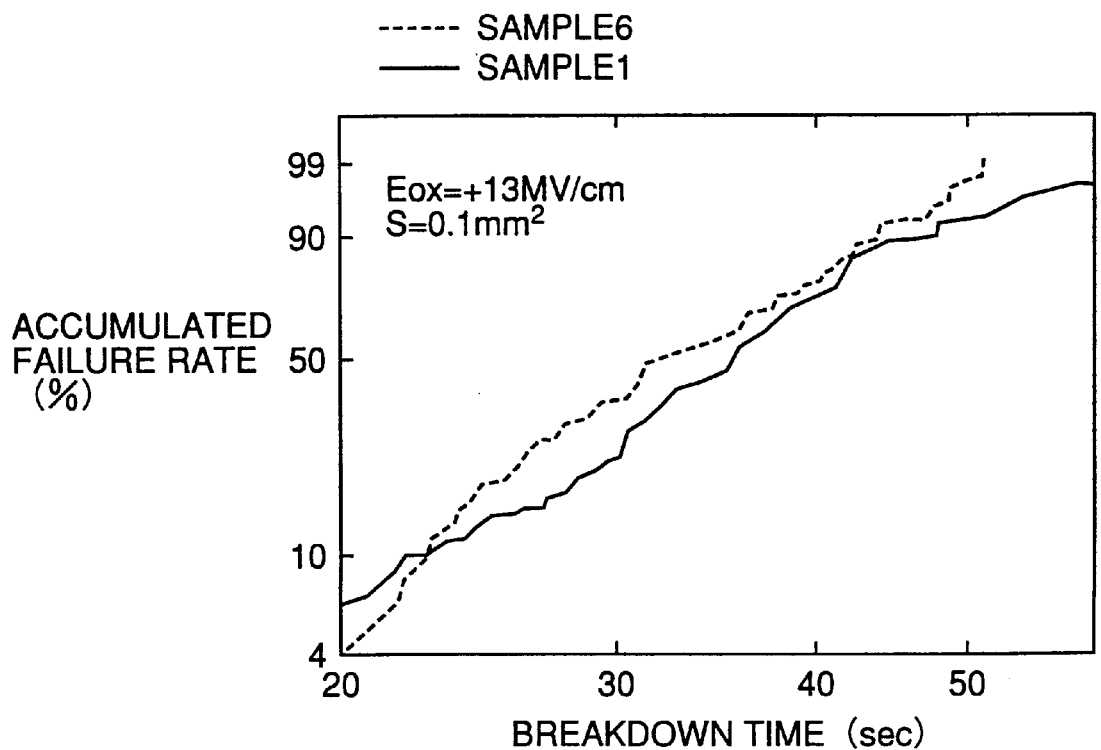
FIGS. 20 to 24 are graphs showing relation between the time of breakdown and accumulated failure rate of Samples 1 to 5 in comparison with Sample 6.
Figure 21:
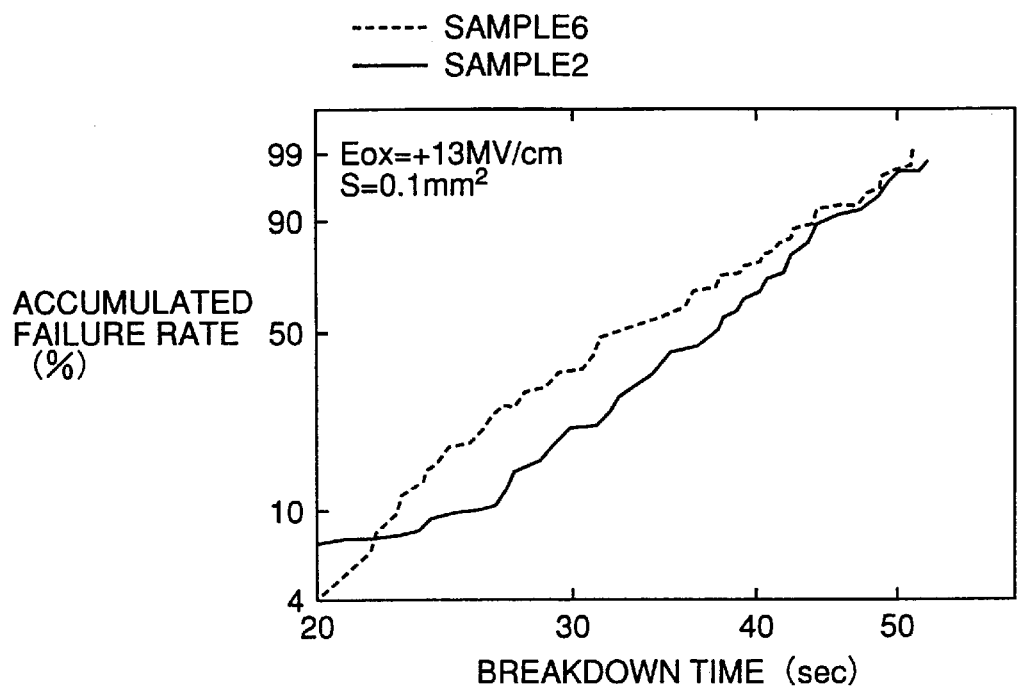
Figure 22:
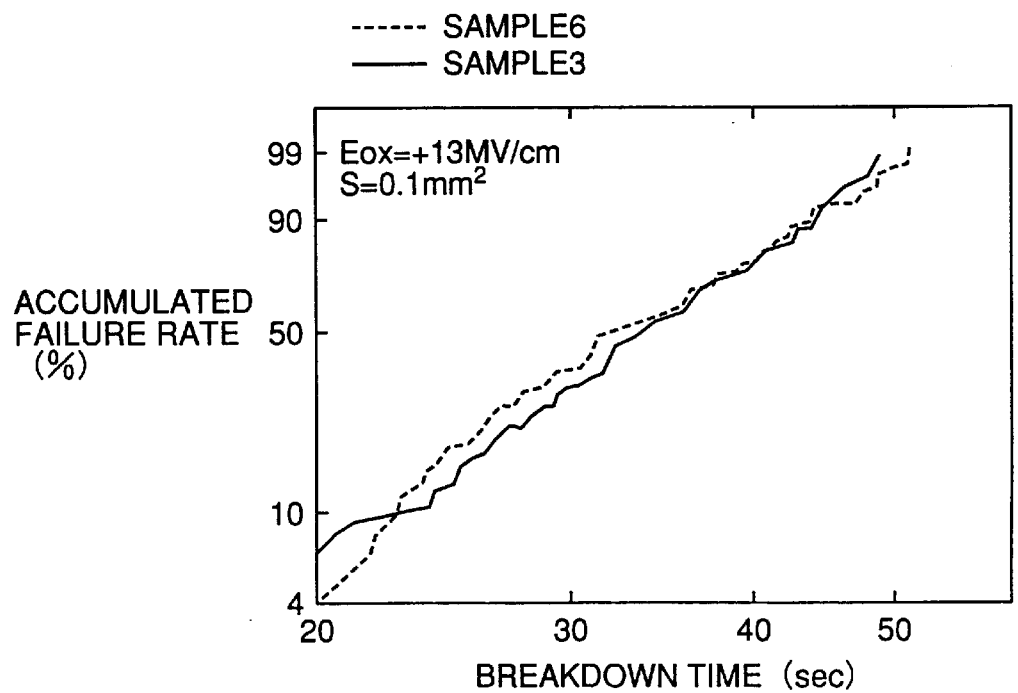
Figure 23:
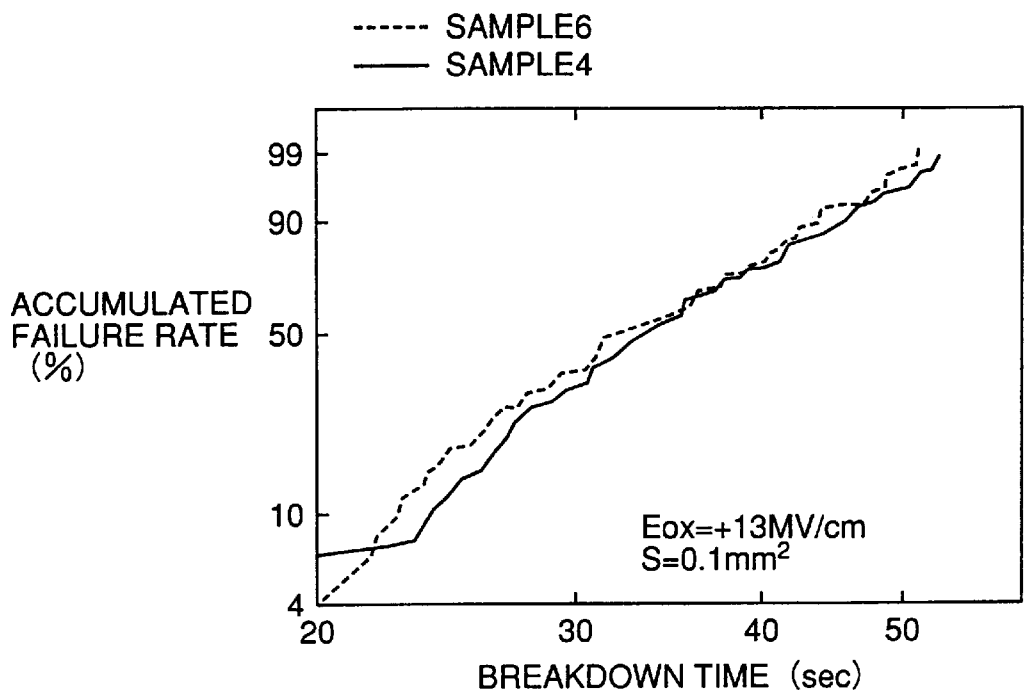
Figure 24:
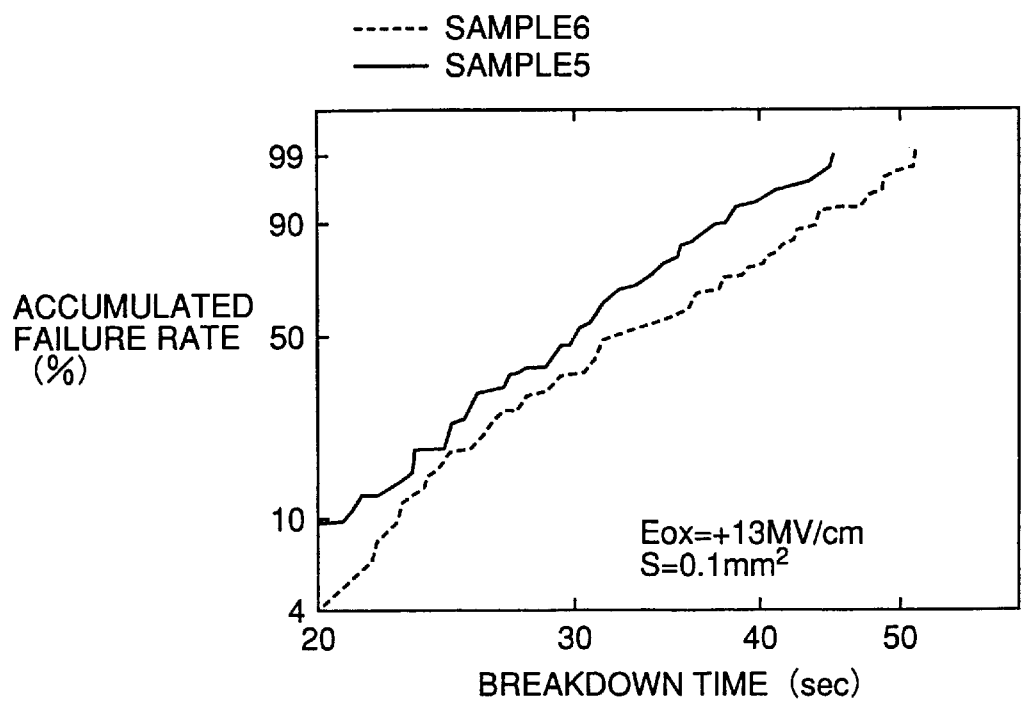

Measurement of TDDB (Time Dependent Dielectric Breakdown) Characteristic Under Positive Bias Condition Referring to FIG. 19, the transistors of Sample 1 was manufactured. Silicon substrate 1 and source·drain regions 5a and 5b were set to the ground potential. Gate electrode 4, ampere meter 10 and variable gate power supply 8 were connected. Opposing area S between channel region 1a and gate electrode 4 was set to 0.1 mm². In this state, a gate voltage $V_G$, which would provide an electric field $E_{OX}$ applied to gate insulating film 6 of +13 MV/cm, was calculated in accordance with the following equation, and the gate voltage $V_G$ was applied to gate electrode 4.

$$V_G=VFB+2\phi F+T_{ox}E_{ox} \qquad (A)$$

VFB: flat band voltage

φF: Fermi potential $T_{ox}$: thickness of gate insulating film 6

$E_{ox}$=+13 MV/cm

The time of application of gate voltage $V_G$ to gate electrode 4, and the current $I_G$ flowing through ampere meter 10 were measured. Here, when dielectric breakdown of gate insulating film 6 occurs, leakage current increases and the current $I_G$ increases abruptly.

The time immediately after the application of the voltage $V_G$ to gate insulating film 6 until abrupt increase in current $I_G$ in 97 transistors as Sample 1 was measured as breakdown time ($t_1, t_2, \ldots, t_{97}$). Transistors of Samples 2 to 6 were manufactured and similar measurement was performed.

Here, "accumulation failure rate" represents ratio of samples subjected to dielectric breakdown out of 97 samples at a certain breakdown time. From FIGS. 20 to 24, it is noted that the accumulation failure rate is slightly increased in Sample 5. However, transistors of Samples 1 to 4 in accordance with the present invention suppress dielectric breakdown to the same extent or higher extent as conventional transistors (Sample 6). Thus, highly reliable transistors are provided.

Figure 25:
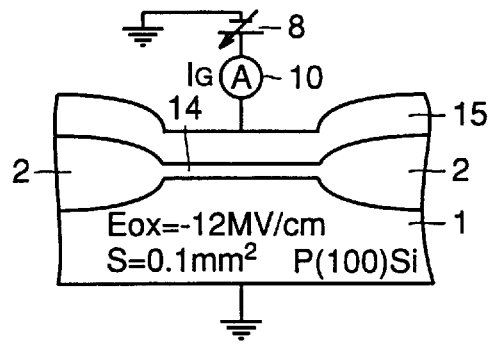
Figure 26:
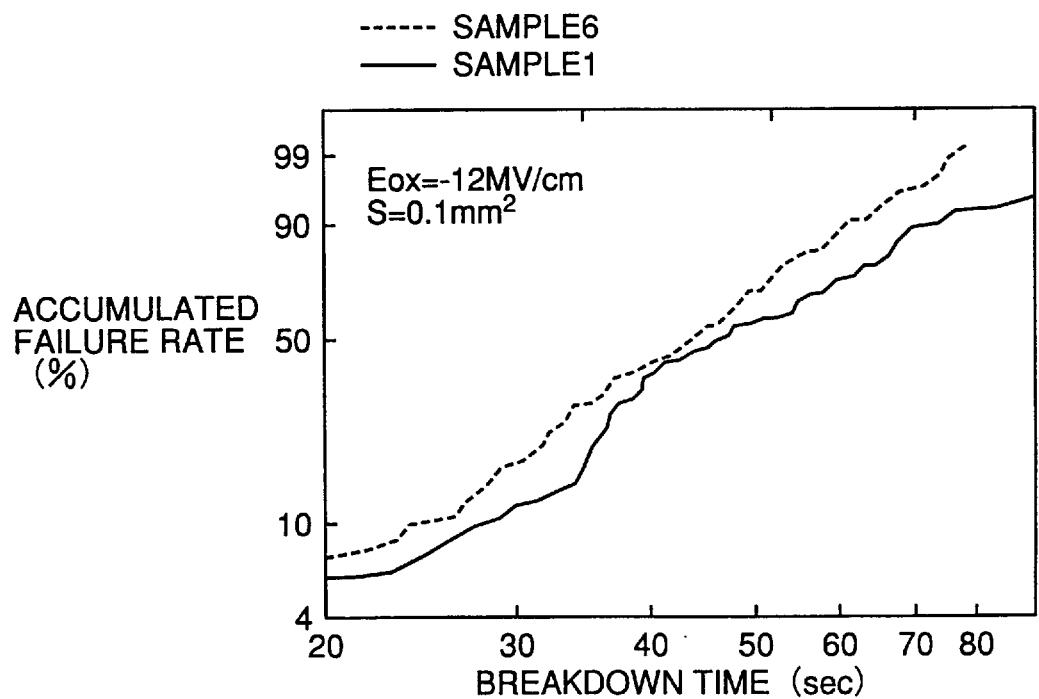
FIGS. 26 to 30 are graphs showing relation between the time of breakdown and accumulated failure rate of Samples 1 to 5 in comparison with Sample 6 under a negative bias condition.
Figure 27:
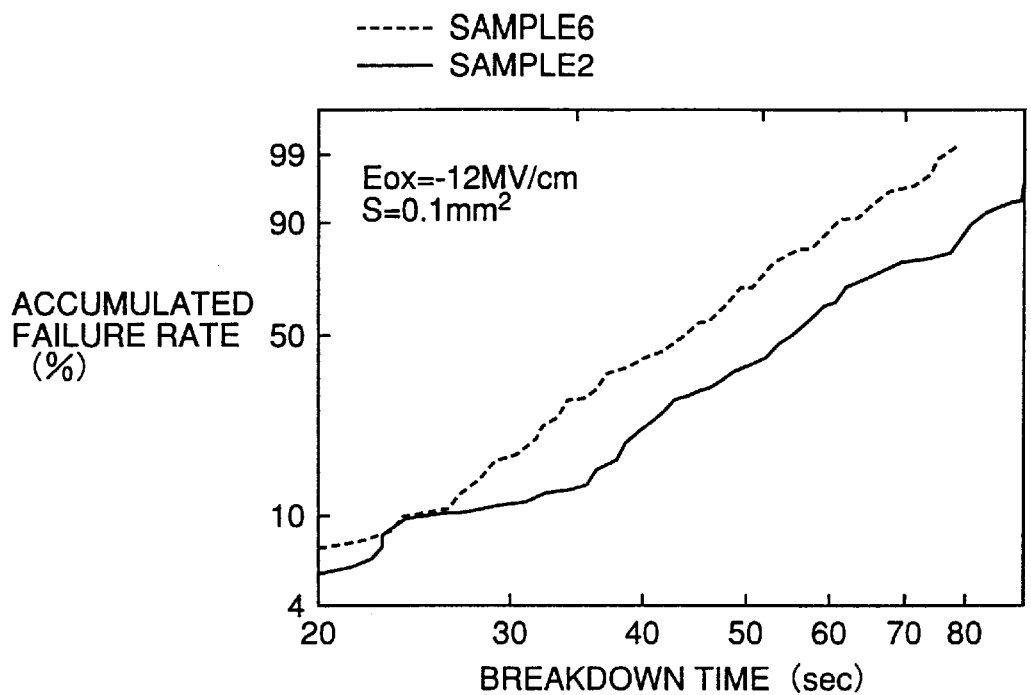
Figure 28:
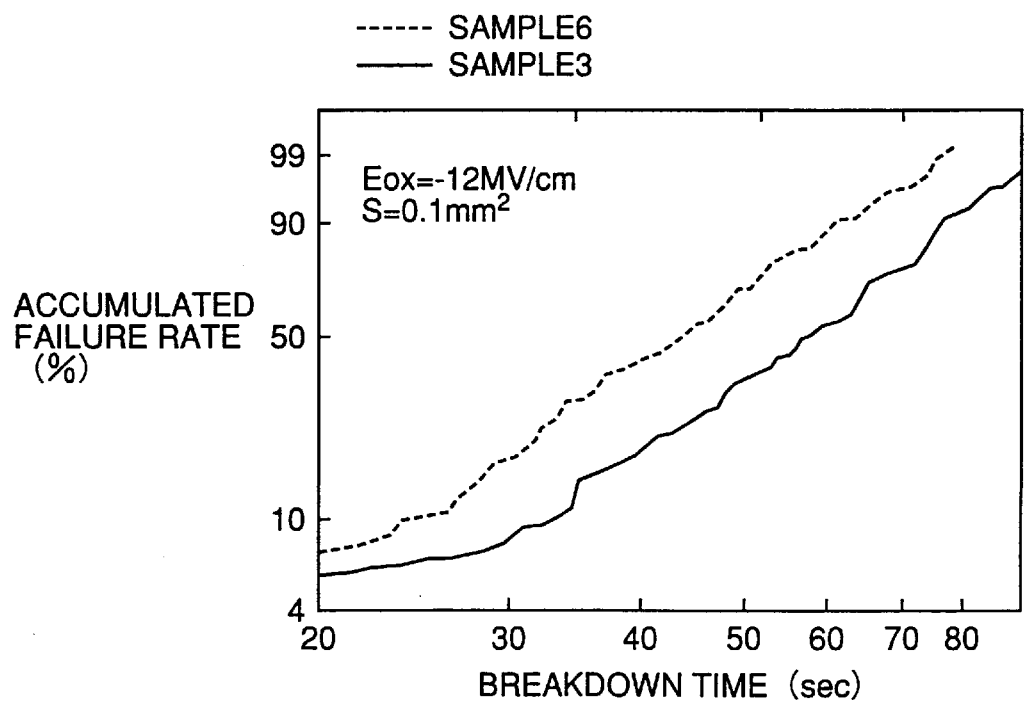
Figure 29:
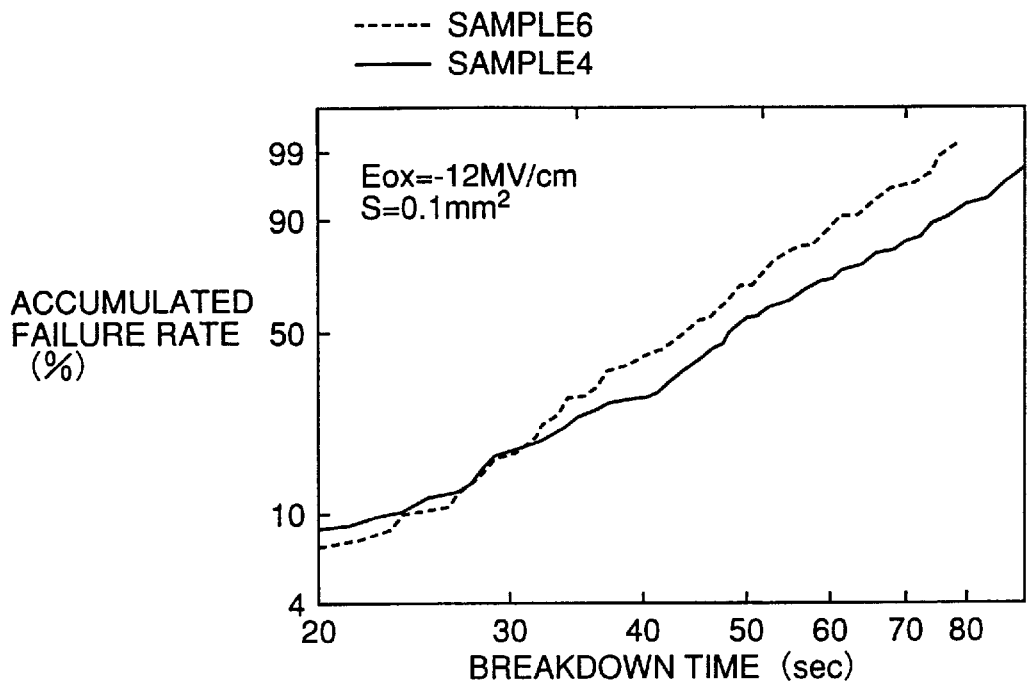
Figure 30:
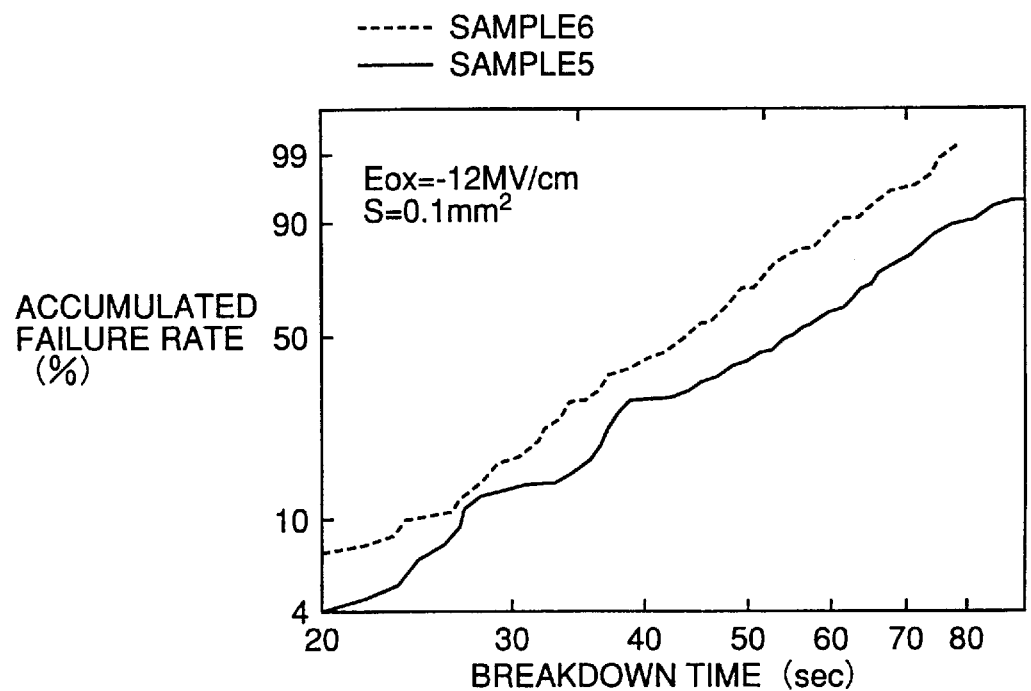

Measurement of TDDB (Time Dependent Dielectric Breakdown) Characteristic Under Negative Bias Condition Referring to FIG. 25, isolation insulating film 2 and silicon nitrided oxide film 14 were formed on silicon substrate 1, and gate electrode 15 was formed thereon. Transistors of Samples 1 to 6 were manufactured in this manner. Silicon substrate 1 was set to the ground potential, and gate electrode 15, ampere meter 10 and variable gate power supply 8 were connected.

In this state, gate voltage $V_G$ applied to gate electrode 15, providing electric field $E_{ox}$ of −12 MV/cm applied to gate insulating film 14 was calculated in accordance with the equation (A) above. The time of application of $V_G$ to gate electrode 15, and the current $I_G$ flowing through ampere meter 10 were measured. Here, when dielectric breakdown of gate insulating film 14 occurs, leakage current increases and current $I_G$ increases abruptly. The time immediately after application of voltage $V_G$ to gate electrode 15 until abrupt increase of current $I_G$ was measured for 97 samples, as breakdown time $(t_1, t_2, \ldots, t_{97})$.

From FIGS. 26 to 30, it is noted that breakdown time of the present invention (Samples 1 to 5) is longer than that of the conventional transistor (Sample 6). Therefore, when the gate insulating film is manufactured in accordance with the present invention, dielectric breakdown can be suppressed and highly reliable transistor can be provided.

(SECOND EMBODIMENT)

Formation of Silicon Nitrided Oxide Film

In the similar manner as the first embodiment, a silicon oxide film having the thickness of 80 µm was formed on a silicon substrate by pyrogenic oxidation.

Thereafter, in a batch furnace of heater type, flow rate of $N_2O$ gas was set to 4 slm (standard liter per minute), and the silicon substrate was maintained in an atmosphere at a temperature of 90° C. for 30 minutes, whereby a silicon oxide film was nitrided. In this manner, a silicon nitrided oxide film (A) having the thickness of 100 Å was formed.

SIMS (Secondary Ion Mass Spectroscopy) Analysis

The principle of SIMS will be briefly described. When a surface of a solid body is irradiated with an ion beam, the ion beam collides atoms at the surface of the solid body, and part of the atoms go out of the solid body. This phenomenon is referred to as sputtering, and part of atoms going out by sputtering are emitted as ions (secondary ions). By analyzing secondary ion mask, it is possible to analyze elements of the solid body. By continuing sputtering, it is possible to know distribution of elements in the depth direction of the solid body. Sample 7 was analyzed by SIMS.

Figure 31:
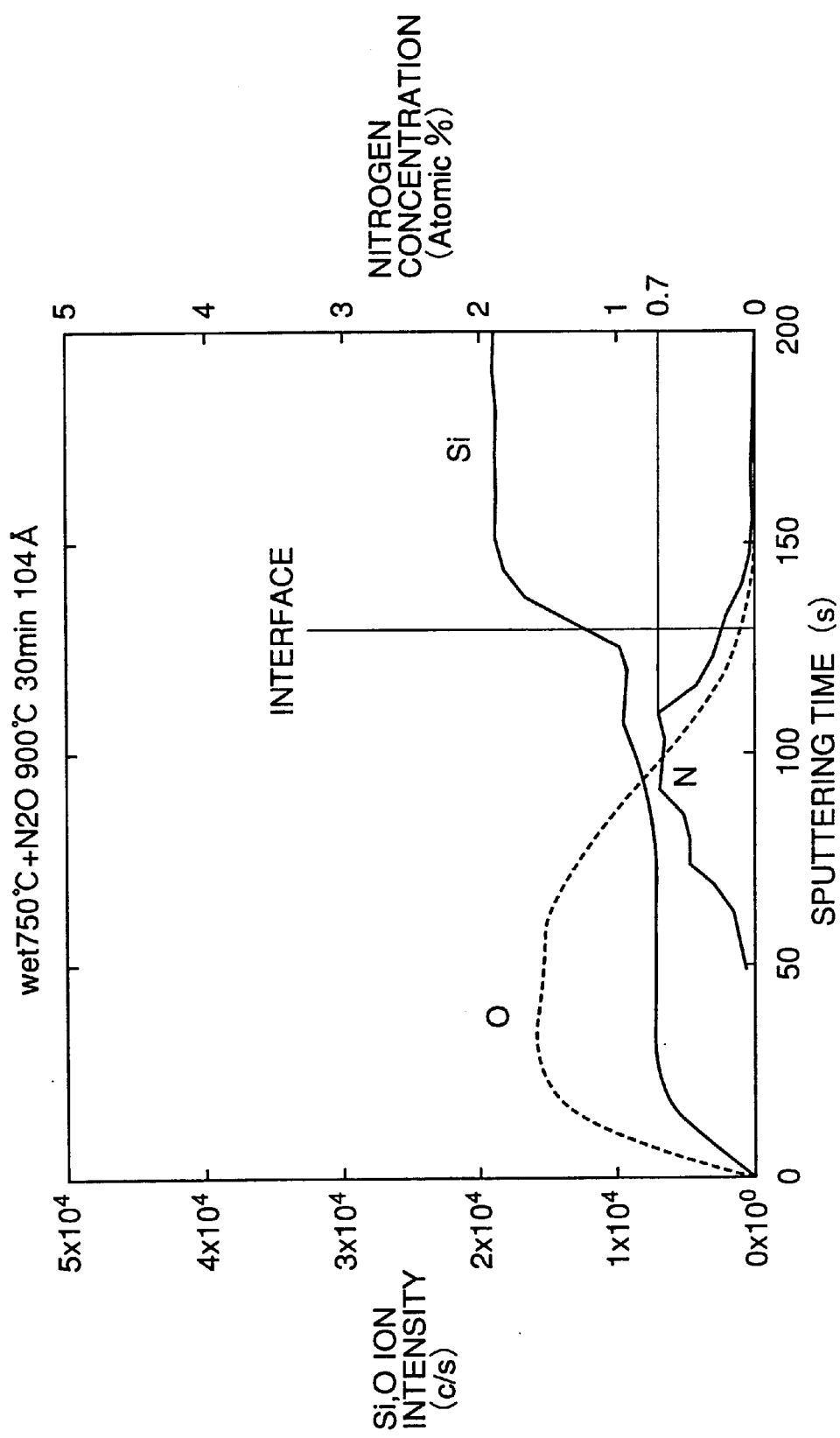
FIG. 31 shows distribution of nitrogen atoms, oxygen atoms and silicon atoms in a silicon nitrided oxide film (A).

Referring to FIG. 31, an interface between the silicon substrate and the silicon nitrided oxide film corresponds to the sputtering time of about 130 seconds, a portion corresponding to the sputtering time of exceeding 130 seconds represents composition of silicon substrate, and a portion corresponding to the sputtering time of shorter than 130 seconds represents composition of the silicon nitrided oxide film. It is understood that nitrogen concentration distribution exist only near the interface between the silicon substrate and the silicon nitrided oxide film. Further, nitrogen concentration has the maximum value only in the vicinity of the interface between the silicon substrate and the silicon nitrided oxide film.

XPS (X-ray Photoelectron Spectroscopy) Analysis

The principle of XPS will be briefly described. When a surface of a solid body is irradiated with X-ray, inner shell level electrons obtained energy from the X-ray by photoelectric effect, and goes out from the solid body. The electron is referred to as a photoelectron, and kinetic energy Ek of the photoelectron corresponds to a difference between the energy Ex of the irradiated X-ray and binding energy of the electron, and therefore it is represented as Ek=Ex−Eb. Ex is known, and therefore when Ek is measured by an energy spectroscopy, the binding energy Eb of electrons can be found by Eb=Ex−Ek. The inner shell level of the electron can be found based on the binding energy, and as the inner shell level is related to the state of chemical bonding, the state of bonding can be evaluated.

Actual XPS analysis was performed using angle-resolved XPS method.

Until photoelectrons generated in the solid body goes out to vacuum, part of the photoelectrons are scattered by solid atoms, and lose energy. Compared with photoelectrons generated at a shallow portion, photoelectrons generated at a deep portion pass over a longer distance in the solid body, and therefore possibility of such photoelectrons to go out to vacuum (possibility of escape) is smaller. A distance from the surface where possibility of escape is 1/e is referred to as mean free path, while the possibility of escape at the outermost surface is 1. When an angle of detection of a photoelectron is made shallower, the distance of passage through the solid body until the photoelectron goes out to vacuum becomes longer, even the photoelectron is generated at the same depth. More specifically, amount of signals from shallower region increases relatively, and hence effective mean free path can be made shorter. In this manner, by changing the angle of detection, depth of signal generation can be changed, and hence information in the depth direction is obtained. Even when the angle of detection is increased to make it deep, however, signals at shallower portions are detected superposed thereon. Accordingly, in order to convert the signals into concentration distribution in the depth direction, a model in which a film is divided into layers of definite thicknesses is used, and analysis is performed using simulation and curve fitting.

When the layers are referred to as first, second, . . . , nth layer starting from the surface, photoelectrons generated in the jth layer are successively attenuated through j−1 layers and exit to vacuum. The sum of these photoelectrons generated from the first to nth layers represents the total amount of photoelectrons actually detected. When concentration of N (nitrogen) in the jth layer is represented by N (j), then the total amount R of intensities of photoelectrons generated from N (nitrogen) atoms is a function of N (j). When R is measured with the value θ changed, unknown number is N (j) only. However, it is difficult to solve this equation for N (j). Therefore, a value N (j) of which (N (j), θ) value matches actually measured data is found by curve fitting using a computer. The value N (j) found in this manner corresponds to N concentration distribution in the depth direction.

Further, XPS spectrum of N1s (1s orbit of nitrogen atoms) is divided into peaks of $Si_3\equiv N$ and $Si_2=N-O$, depth distribution was calculated for each, by angle-resolved spectroscopy. The state of bonding of atoms in silicon nitrided oxide film (A) obtained in the above described manner was analyzed by such XPS.

Figure 32A:
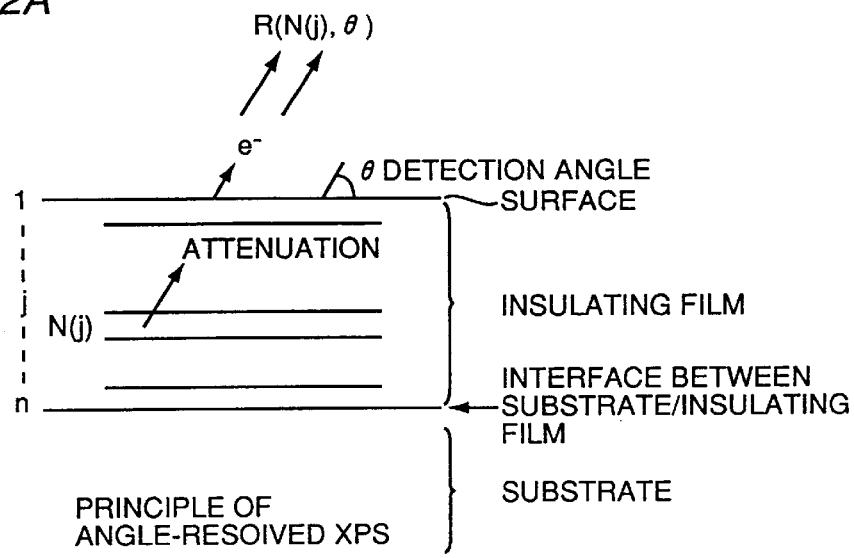
FIG. 32A shows a model in which a nitrided oxide film is divided into several layers.
Figure 32B:
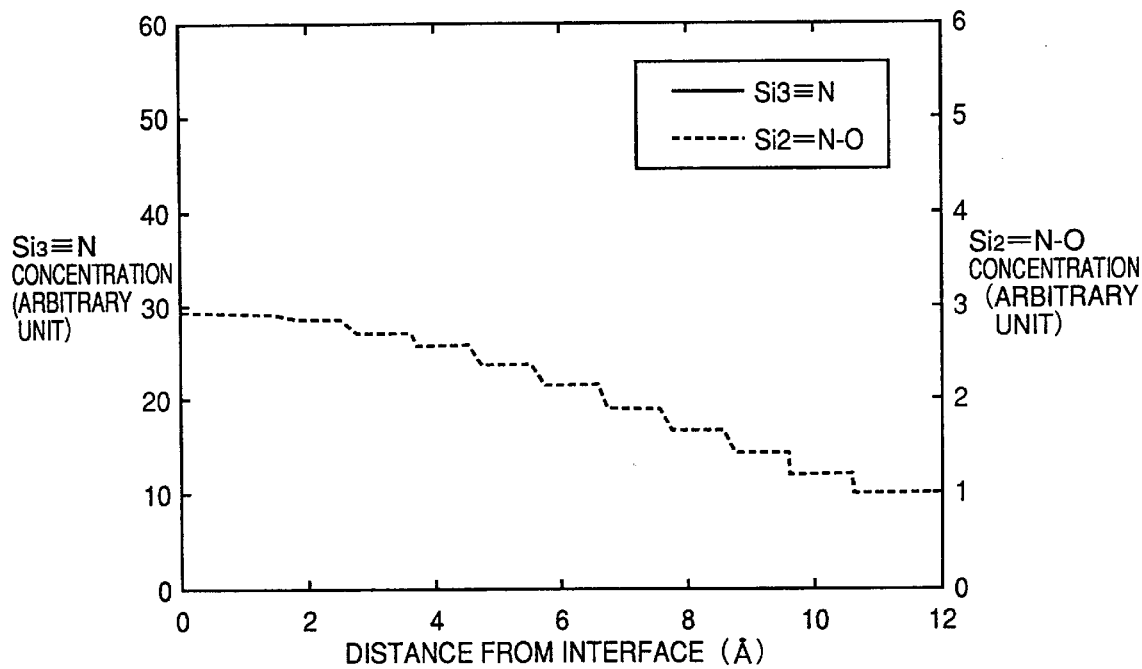
FIG. 32B is a graph showing the state of bonding of nitrogen in the silicon nitrided oxide film (A).

In FIG. 32B, "distance from the interface" refers to a distance between the interface of the silicon substrate and the silicon nitrided oxide film to an inner portion of a silicon nitrided oxide film. Further, "$Si_3\equiv N$ concentration" refers to ratio of nitrogen atoms bonded to three silicon atoms with respect to all atoms.

"$Si_2=N-O$ concentration" refers to ratio of nitrogen atoms bonded to two silicon atoms and one oxygen atom, with respect to all atoms. "$Si_3\equiv N$ concentration" is scaled ten times larger than "$Si_2=N-O$ concentration." It can be seen from FIG. 32B that in the vicinity of the interface between the silicon substrate and the silicon nitrided oxide film, every nitrogen atom is bonded to two silicon atoms and one oxygen atom.

Fabrication and Analysis of Comparative Samples

A silicon oxide film was formed on a silicon substrate by pyrogenic oxidation in the similar manner as the first embodiment, at a temperature of 750° C. The silicon oxide film was nitrided for two minutes by ammonium gas at a temperature of 900° C., and thus a silicon nitrided oxide film (B) was formed.

Figure 33:
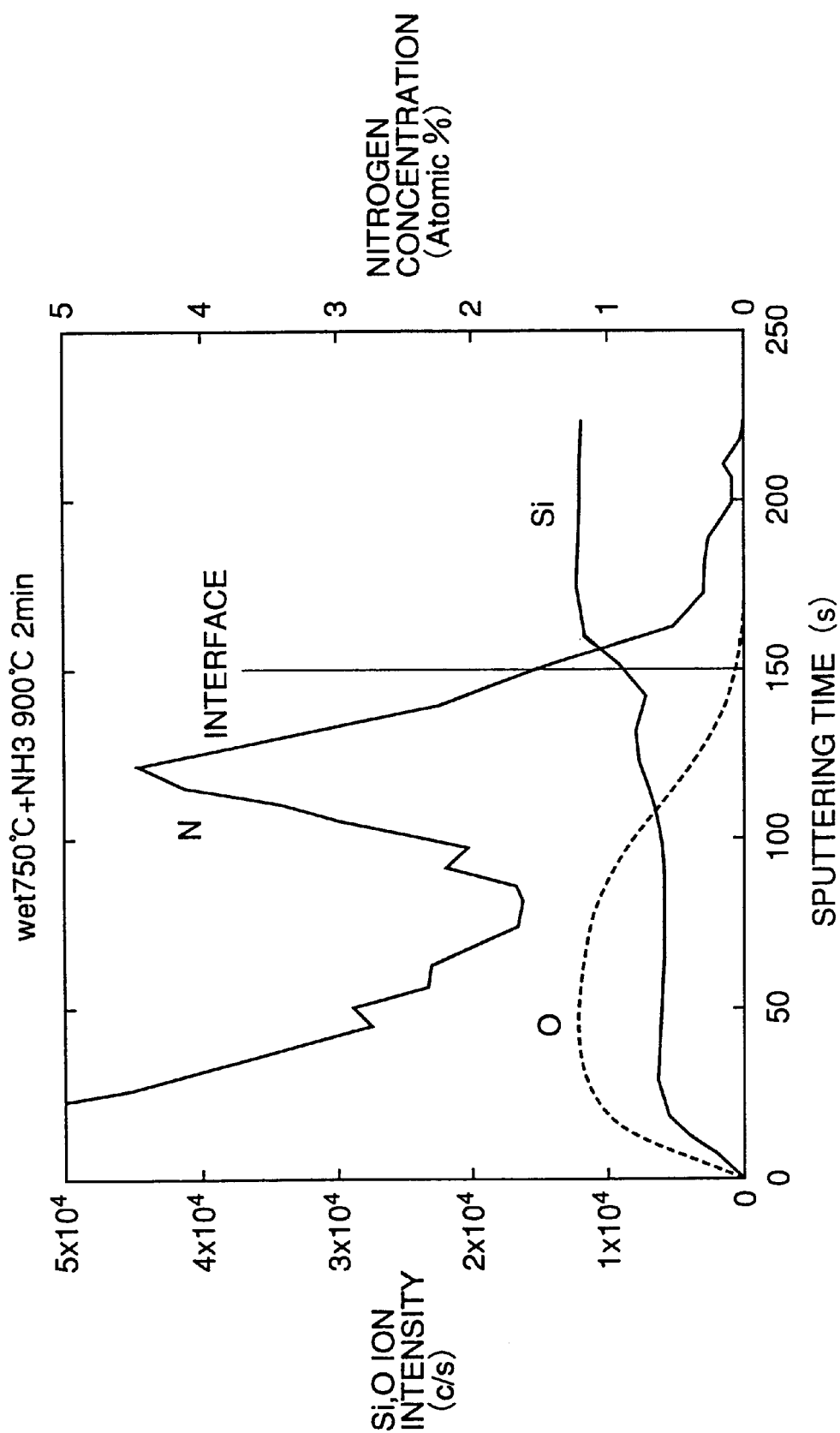
FIG. 33 is a graph showing distributions of nitrogen atoms, oxygen atoms and silicon atoms in a nitrided oxide film (B) for comparison.
Figure 34:
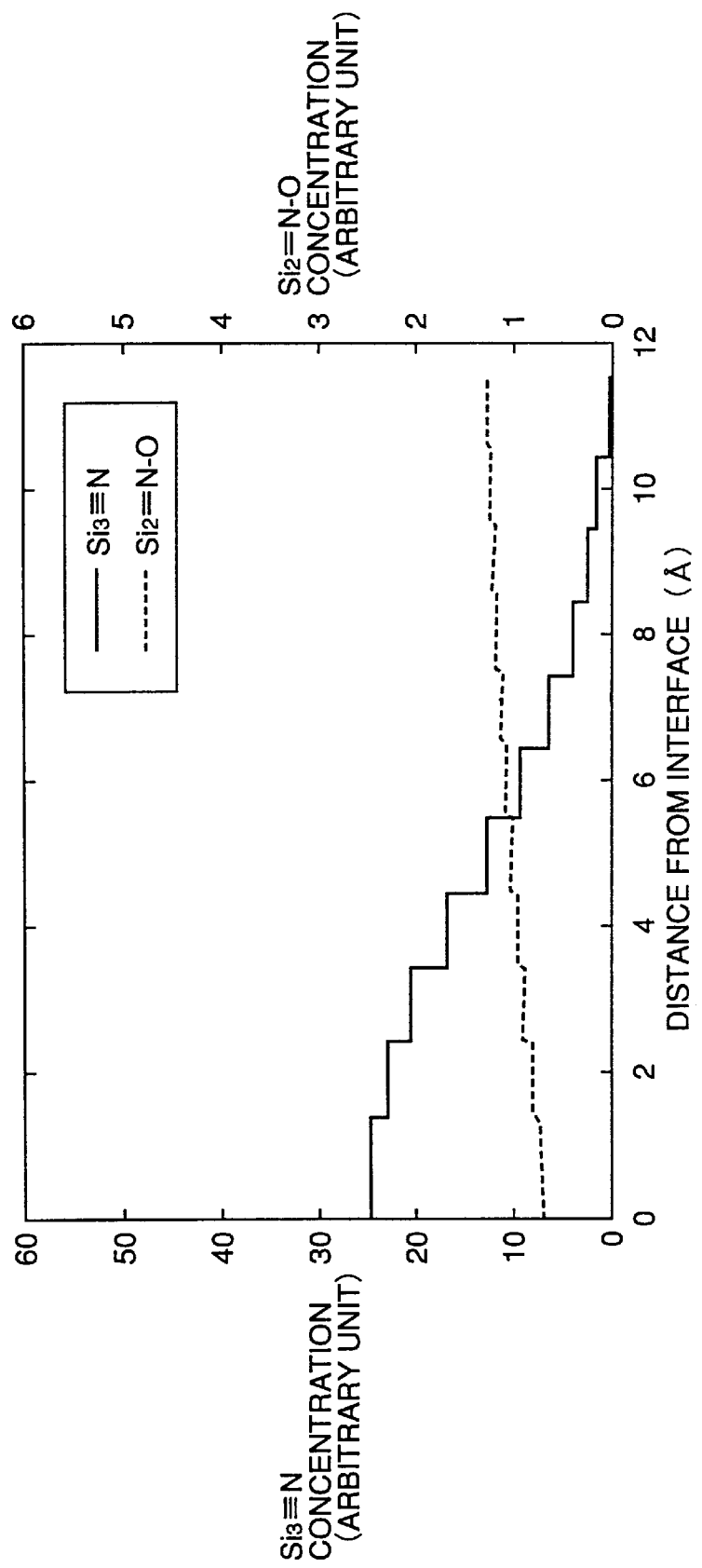
FIG. 34 is a graph showing the state of bonding of nitrogen in the nitrided oxide film (B) for comparison.

Referring to FIGS. 33 and 34, when nitrided with ammonium, the amount of nitrogen in the silicon nitrided oxide film is increased than when nitrided with $N_2O$ as shown in FIGS. 32 and 31. However, distribution of nitrogen is wider, and the nitrogen extends to be bonded to three silicon atoms.

Measurement of Charge Retention Characteristic

Figure 35:
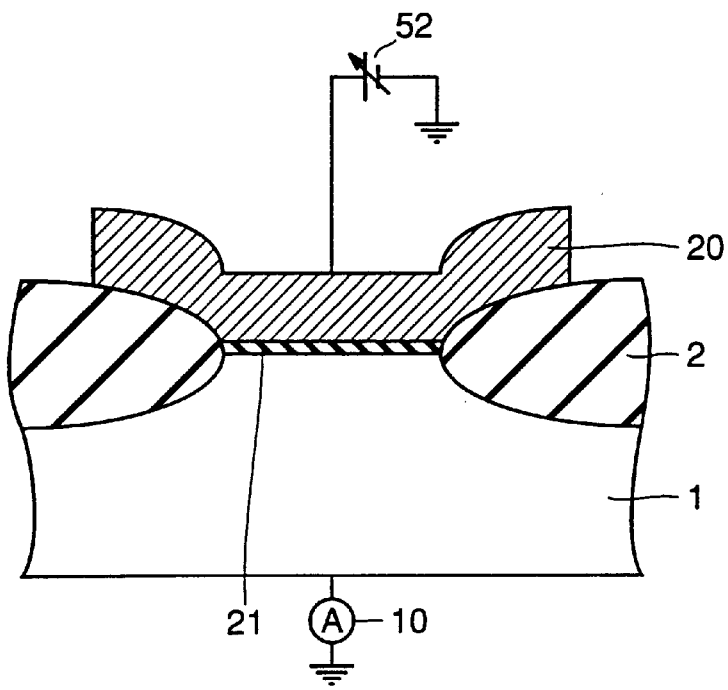
FIG. 35 is an illustration related to the method of measuring electric field and current density of the gate insulating film.

Referring to FIG. 35, in a region surrounded by isolation oxide film 2 formed at the surface of silicon substrate 1, a gate insulating film 21 having the thickness of 100 Å formed of silicon nitrided oxide film (A) was provided. A doped polysilicon film 20 was formed on gate insulating film 21 and was connected to a variable power supply 52. Silicon substrate 1 was set to the ground potential. By changing the voltage of variable power supply 52, the current flowing through ampere meter 10 was measured in this manner.

Thereafter, electrons are introduced at a current density of 0.02 A/cm² for 50 seconds to gate insulating film 21 to apply electrical stress on gate insulating film 21.

Thereafter, various voltages were applied by variable power supply 52 to the electrically stressed gate insulating film 21, and the current flowing through ampere meter 10 was measured.

Further, the gate insulating film 21 was replaced by a silicon oxide film having the thickness of 100 Å, and similar experiments were performed.

Figure 36:
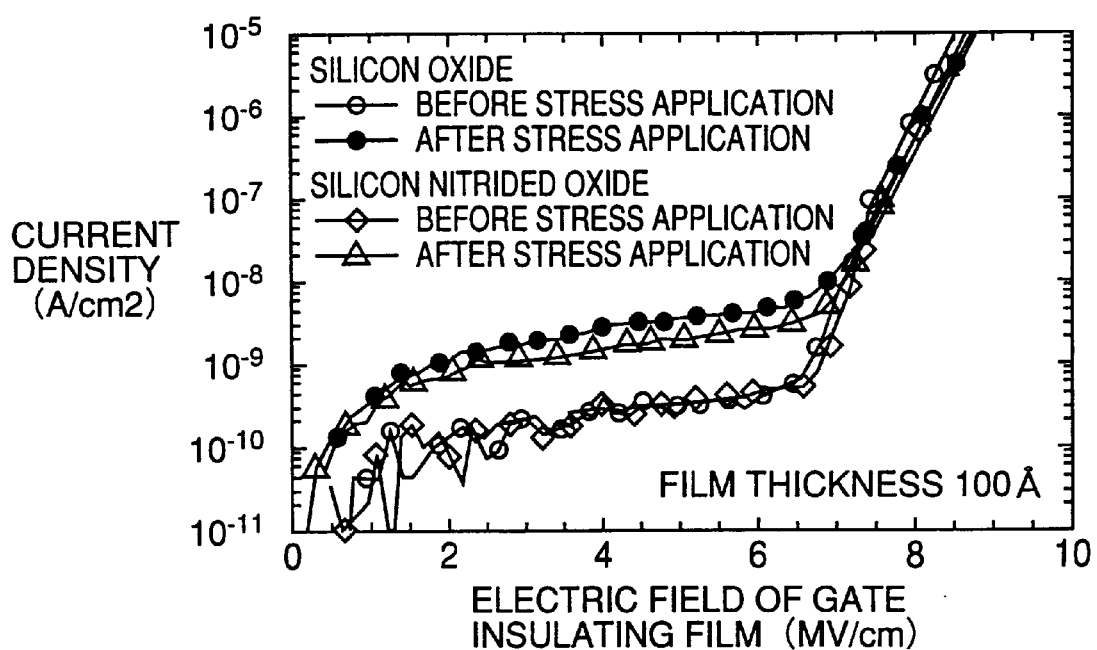
FIG. 36 is a graph showing relation between the current density and electric field in the silicon nitrided oxide film (A).

In FIG. 36, the mark "○" represents the silicon oxide film before application of electrical stress, "●" represents the silicon oxide film after application of the electrical stress, "◇" represents the silicon nitrided oxide film before application of the electrical stress, and "Δ" represents the silicon nitrided oxide film after application of the electrical stress. The same applies to FIGS. 38 and 44.

From FIG. 36, it can be understood that the silicon nitrided oxide film manufactured in accordance with the present invention comes to have smaller current density after application of the electrical stress, as compared with the silicon oxide film. This means that the film has high insulation even after application of a high electric field, that is, it has improved charge retention characteristic.

Figure 37:
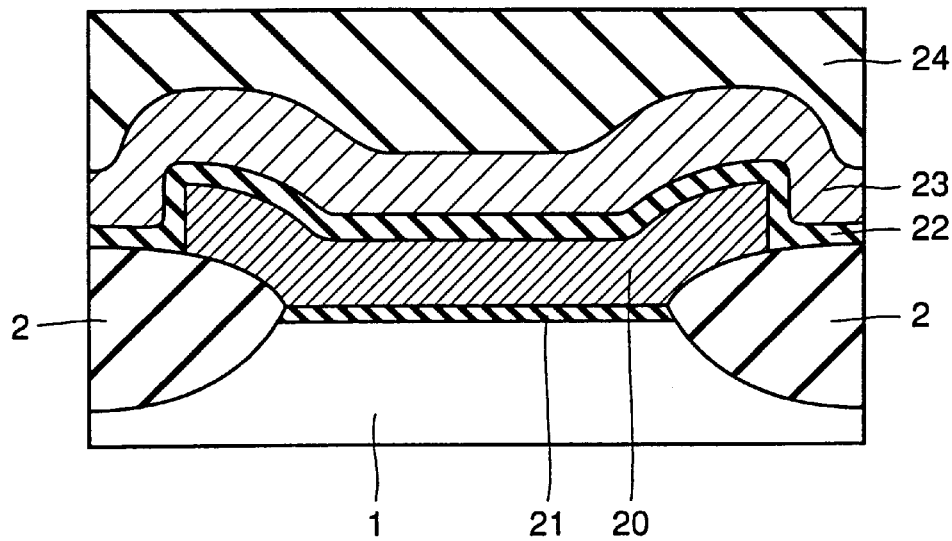
FIG. 37 is a cross sectional view showing a memory cell of a flash memory using the silicon nitrided oxide film manufactured in accordance with the present invention as the gate insulating film.

In FIG. 37, a gate insulating film 21 of silicon nitrided oxide film (A) is formed between silicon substrate 1 and floating gate electrode 20.

As for other structure, isolation insulating film 2 is formed on the surface of silicon substrate 1, an ONO film (a stack film including a silicon oxide film, a silicon nitride film and a silicon oxide film) 22, a control gate electrode 23 and an interlayer insulating film 24 are formed to cover floating gate electrode 20 and isolation insulating film 2.

In such a structure, since gate insulating film 21 has high charge retention characteristic, charges once stored in floating gate electrode 20 do not leak to silicon substrate 1, and therefore a flash memory having superior charge retention characteristic is obtained. Further, when etched by using hydrofluoric acid, N—O bonding is easier to be disconnected than N—Si bonding. Therefore, the present invention facilitates etching as compared with a nitrided oxide film in which nitrogen is bonded to three silicon atoms.

(THIRD EMBODIMENT)

Formation of Silicon Nitrided Oxide Film

A silicon oxide film having the thickness of 86 Å was formed on a silicon substrate by pyrogenic oxidation in the similar manner as the first embodiment.

Thereafter, in a batch furnace of heater type, the silicon oxide film was nitrided for 30 minutes by $N_2O$ gas with the flow rate of 4 slm at the temperature of 850° C., and thus a silicon nitrided oxide film (C) was formed. Thickness of silicon nitrided oxide film (C) was 100 Å, which was 1.16 times that of the silicon oxide film. The ratio of increase in film thickness at this time was calculated in accordance with the following equation.

$$A = \frac{B-C}{D}$$

A: Ratio of increase in Film thickness
B: Thickness of Silicon Nitrided Oxide Film
C: Thickness of Silicon Oxide Film
D: Thickness of Silicon Oxide Film The ratio of increase in film thickness of silicon nitrided oxide film (C) was 14%.

Further, a silicon oxide film having the thickness of 100 Å was formed on pyrogenic oxidation on another silicon substrate.

Measurement of Charge Retention Characteristic

Figure 38:
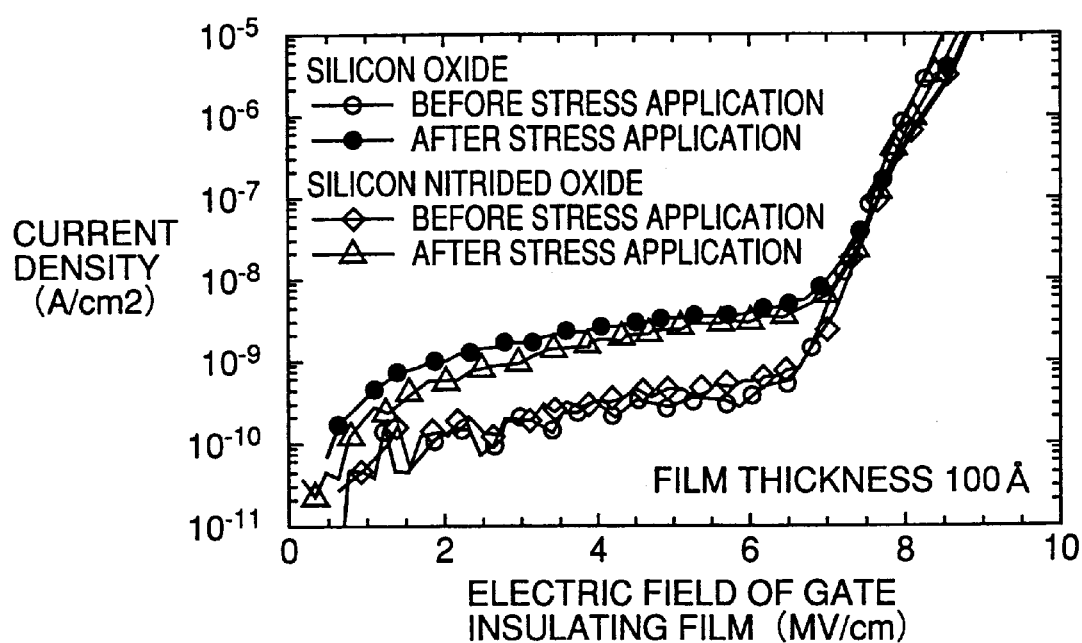
FIG. 38 is a graph showing relation between the current density and the electric field of a silicon nitrided oxide film (C) and a silicon oxide film in comparison with each other.

Electric field and current density of silicon nitrided oxide film (C) having the thickness of 100 Å and of the silicon oxide film having the thickness of 100 Å were measured by the method shown in FIG. 35. The marks "○", "●", "◇", and "Δ" of FIG. 38 represent the same plots as FIG. 36. From FIG. 38, it can be seen that the silicon nitrided oxide film manufactured in accordance with the present invention has high insulation even after application of the electrical stress. Therefore, when the silicon nitrided oxide film (C) is used as the gate insulating film 21 shown in FIG. 37, it is possible to provide a flash memory having high charge retention characteristic.

Measurement of Variation in Threshold Voltages

In accordance with the method described above, silicon nitrided oxide films (D) to (I) represented as Samples 8 to 13 with various ratios of increase in film thickness (D: ratio of increase in film thickness 0%, E: 4%, F: 14%. G: 21%, H: 22%, I: 31%) were manufactured.

Figure 39:
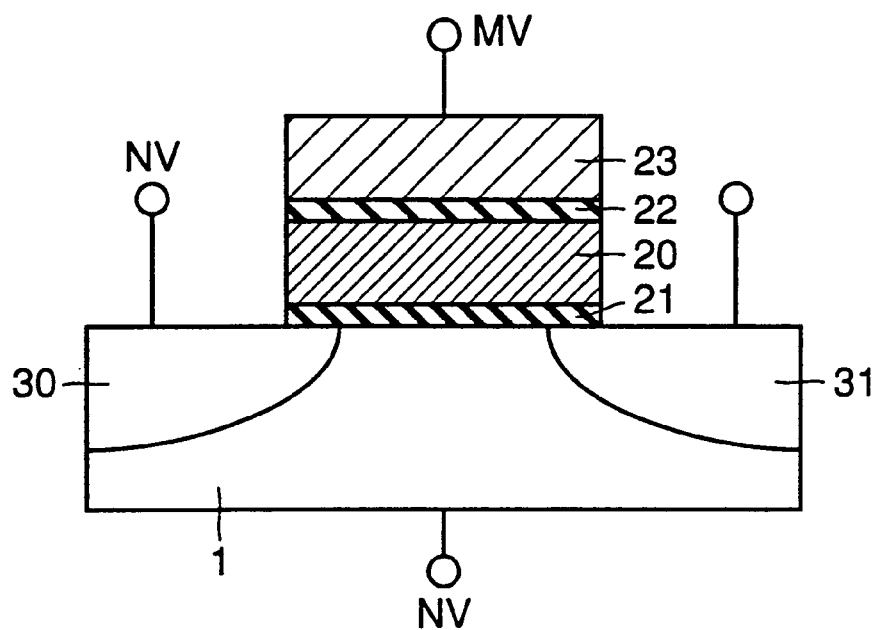
FIGS. 39 and 40 show first and second steps of the method of measuring variation of a threshold voltage of a memory cell of the flash memory.

Referring to FIG. 39, gate insulating film 21 of silicon nitrided oxide film (D) was formed on silicon substrate 1. Floating gate electrode 20, ONO film 22, control gate electrode 23 were formed on gate insulating film 21, and a source region 30 and a drain region 31 were formed on both sides of gate insulating film 21.

In this manner, 28800 memory cells of such flash memories were formed and on one memory cell A thereof, +1V was applied to drain region 31, silicon substrate 1 was set to the ground potential, and a positive voltage was applied to control gate electrode 23. The voltage applied to control gate 23 at the time when the current value flowing between source region 30 and drain region 31 was 30 µA was considered the threshold voltage. Variation in the threshold voltage was measured in the following manner.

First, in one memory cell (A) of 28800 memory cells, drain region 31 was set to a floating state as shown in FIG. 39. A negative voltage NV was applied to source region 30 and silicon substrate 1, a positive voltage MV was applied to control gate electrode, for $t_1$ second, and electrons were introduced to floating gate electrode 20 from silicon substrate 1 for the time period of $t_1$ second. Thus, the threshold voltage attained a positive voltage LV. In other memory cells, source region 30, silicon substrate 1 and control gate electrode 23 were set to potentials as shown in FIG. 39, and electrons were introduced to floating gate electrode 21 for $t_1$ second.

Figure 40:
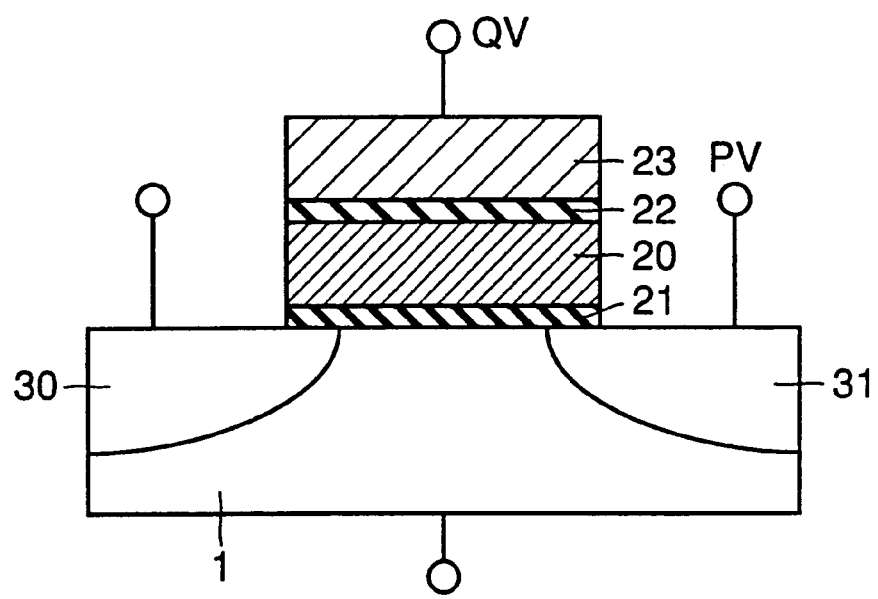

Thereafter, in memory cell A described above, source region 30 and silicon substrate 1 were set to the floating state as shown in FIG. 40. A positive voltage PV was applied to drain region 31 and a negative potential QV was applied to control gate electrode 23, for a time period of $t_2$, and electrons were drawn out from floating gate electrode 20 to drain region 31 for the time period of $t_2$. Consequently, threshold voltage attained $R_1 V$.

In other memory cells, voltages such as shown in FIG. 40 were applied to control gate electrode 23 and drain region 31, electrons were drawn out from floating gate electrode 20 for the time period of $t_2$, and threshold voltages $R_2$ to $R_{28800}$ were measured. Difference between the maximum value and the minimum value of threshold voltages $R_1$ to $R_{28800}$ was considered variation Z of the threshold voltage. Further, memory cells of flash memory were formed in accordance with the manufacturing steps described above on gate insulating film 21 formed of silicon nitrided oxide films (E) to (I), and variation in the threshold voltage was measured.

Figure 41:
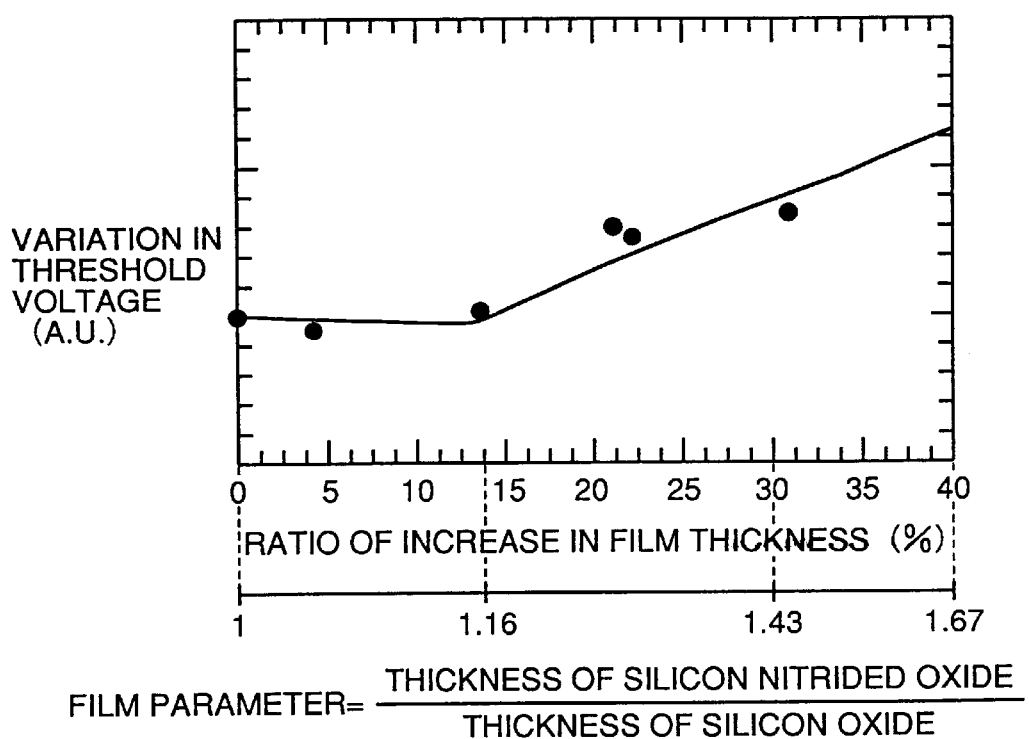
FIG. 41 is a graph showing relation between film parameter, ratio of increase in thickness and variation in the threshold voltage.

It can be seen from FIG. 41 that when the ratio of increase in film thickness exceeds 14% (film parameter 1.16), variation in threshold voltage becomes wider. In order to manufacture flash memories with variation in threshold voltages suppressed, it is preferable to set the ratio of increase in film thickness to be at most 14%, that is, to set film parameter to be at most 1.16.

(FOURTH EMBODIMENT)
Fabrication of Silicon Nitrided Oxide Film

A silicon oxide film having the thickness of 96 Å was formed on a silicon substrate by pyrogenic oxidation in the similar method as shown in FIG. 1 of the first embodiment.

Figure 42:
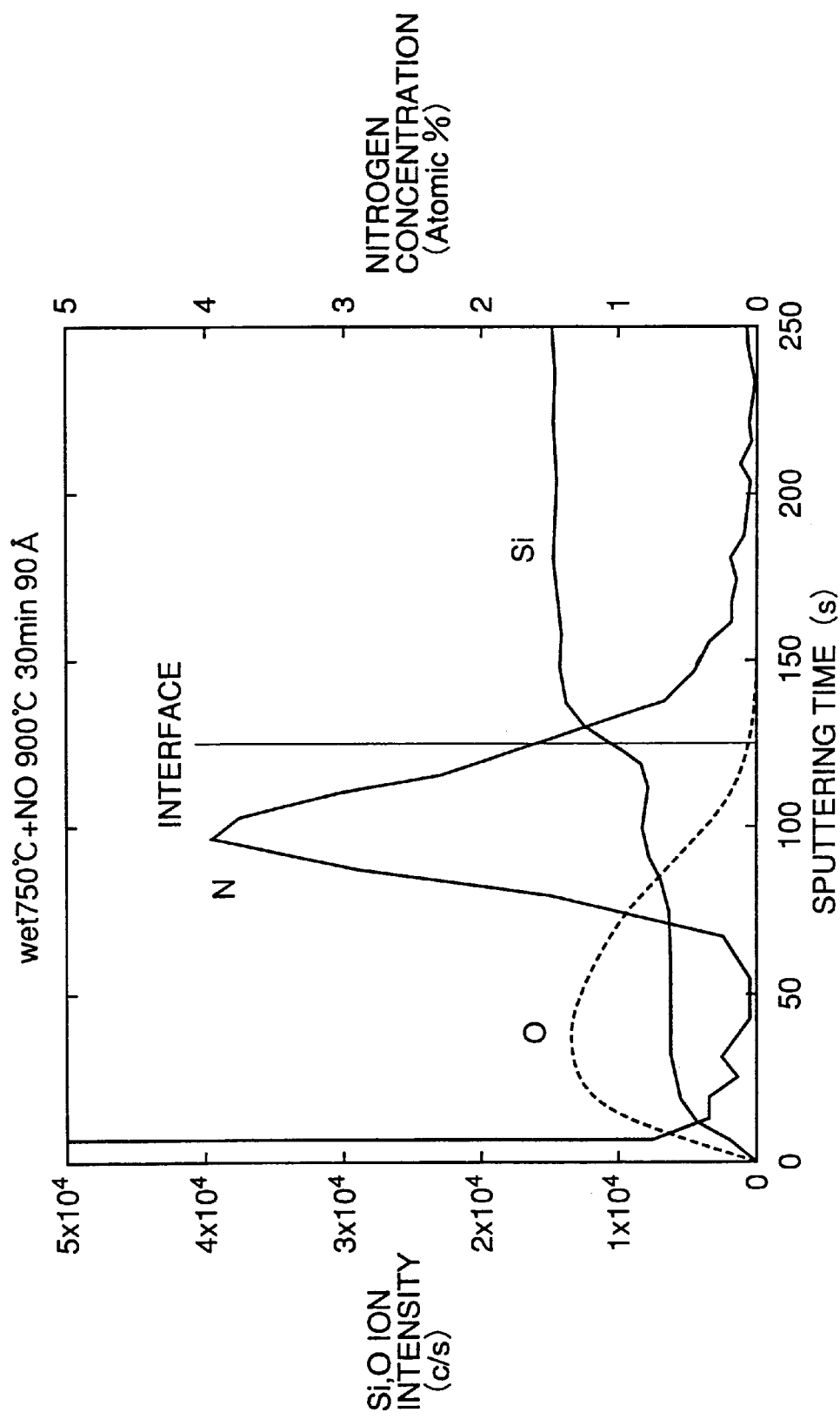
FIG. 42 is a graph showing distributions of nitrogen atoms, oxygen atoms and silicon atoms in a silicon nitrided oxide film (J).

Thereafter, in a batch furnace of heater type, the silicon oxide film was nitrided for 30 minutes in an atmosphere of NO gas with the flow rate of 4 slm at a temperature of 900° C., and a silicon nitrided oxide film (J) having the thickness of 100 Å was formed, which was similar to that shown in FIG. 2 of the first embodiment.
SIMS Analysis and XPS Analysis Referring to FIG. 42, when the sputtering time is between 0 to 30 seconds, nitrogen concentration increases. However, this is because mechanical error, and the nitrogen concentration in this portion is almost 0. Therefore, it is understood that nitrogen distribution exists only in the vicinity of the interface between the silicon substrate and the silicon nitrided oxide film.

Figure 43:
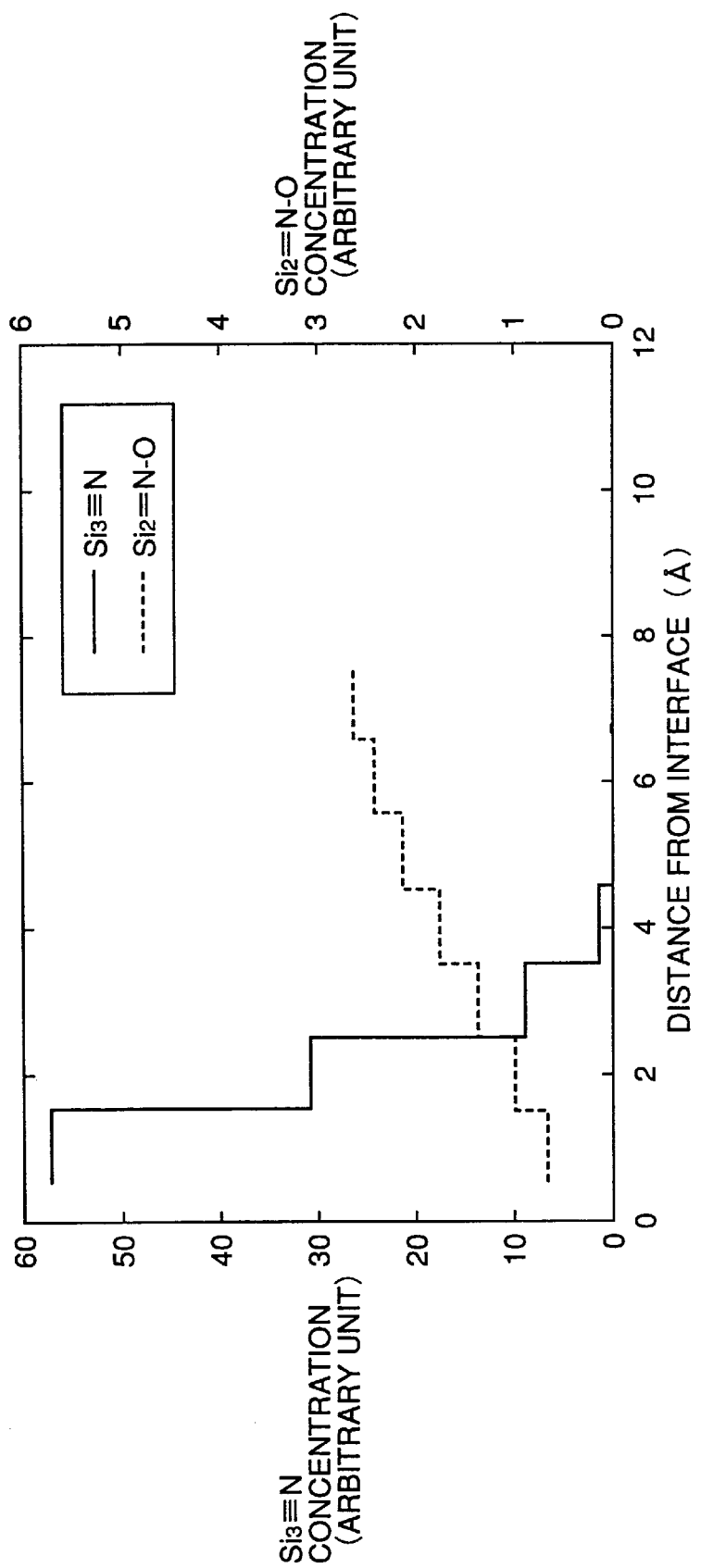
FIG. 43 is a graph showing the state of bonding of nitrogen in the silicon nitrided oxide film (J).

Further, it can be seen from FIG. 43 that nitrogen atoms bonded to three silicon atoms exist only at portions very close to the interface between the silicon substrate and the silicon nitrided oxide film, in the vicinity of the interface. More specifically, such nitrogen atoms exist only in that portion of the silicon nitrided oxide film which is next to the interface.
Measurement of Charge Retention Characteristic The charge retention characteristic of the silicon nitrided oxide film (J) was examined by the method shown in FIG. 35.

Figure 44:
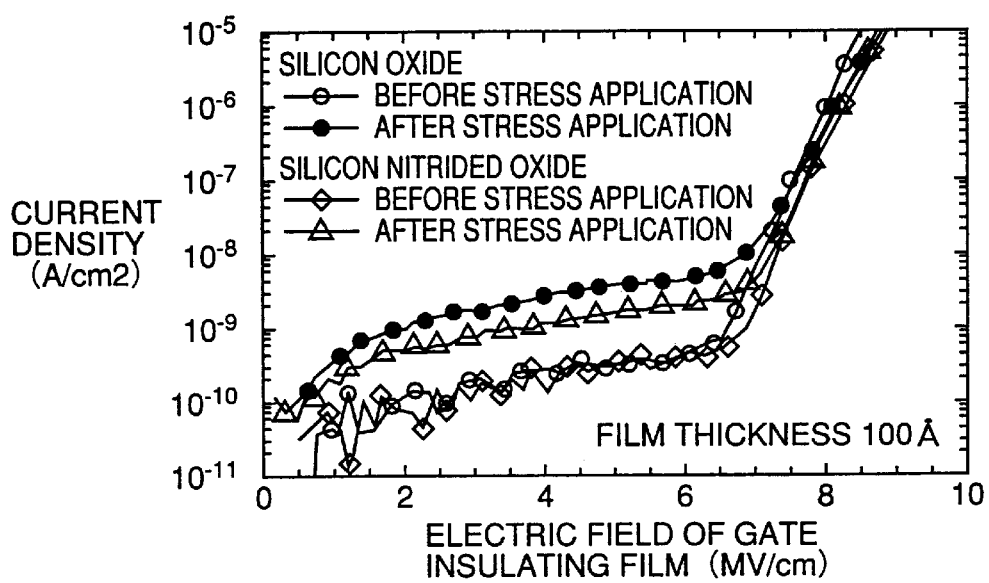
FIG. 44 is a graph showing relation between the current density and the electric field of the silicon nitrided oxide film (J).
Figure 45:
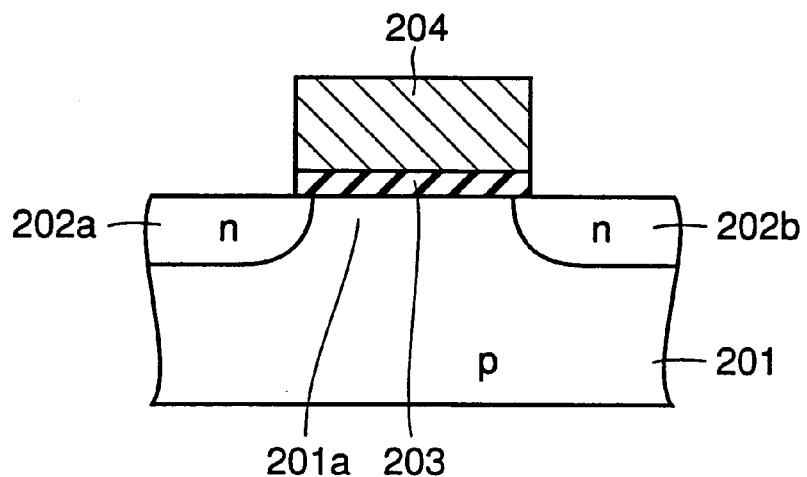
FIG. 45 is a cross section showing a nitrided oxide film used in a conventional transistor.
Figure 46:
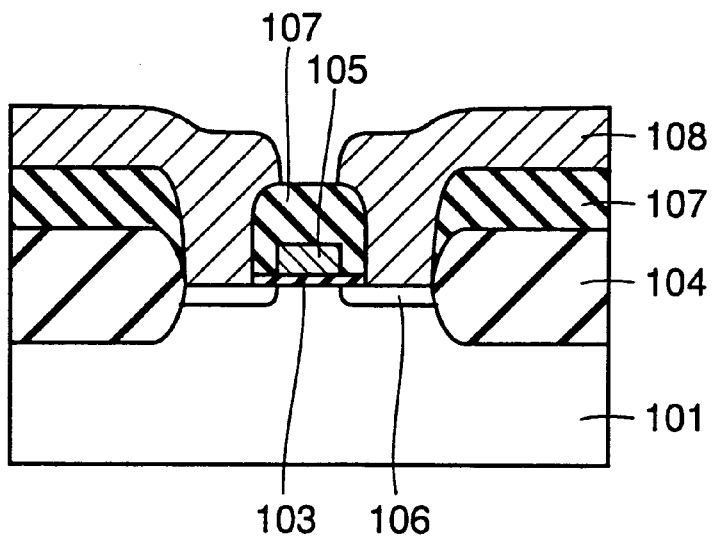
FIG. 46 is a cross section showing an improved nitrided oxide film used in the conventional transistor.

In FIG. 44, marks "○", "●", "◇" and "Δ" represent the same plots as FIG. 36. It can be seen from FIG. 44 that silicon nitrided oxide film (J) has superior insulation even after application of electrical stress. Therefore, when silicon nitrided oxide film (J) is used as gate insulating film 21 shown in FIG. 37, flash memories having superior charge retention characteristic can be manufactured. Further, various silicon nitrided oxide films with different film parameters were fabricated in the similar manner as the third embodiment, and variation in threshold voltages was studied. Similar results as obtained in the embodiment of FIG. 41 were obtained. More specifically, if the film parameter is at most 1.16, variation in the threshold voltage is small.

The embodiments of the present invention described above may be modified variously. In the second to fourth embodiments, the step of forming an oxide film and the step of nitriding may be performed in one same apparatus. Further, thickness of respective films, voltages to be applied and so on may be arbitrarily changed as needed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a silicon substrate;

a silicon nitrided oxide film formed on said silicon substrate; and a gate electrode formed on said silicon nitrided oxide film; wherein nitrogen is distributed only in a vicinity of an interface between said silicon substrate and said silicon nitrided oxide film, and every nitrogen atom is bonded to two silicon atoms and one oxygen atom, in said vicinity of the interface.

2. The semiconductor device according to claim 1, wherein said gate electrode is a floating gate electrode, said semiconductor device further comprising a control gate electrode formed on said floating gate electrode with a dielectric film interposed.

3. A semiconductor device, comprising:

a silicon substrate;

a silicon nitrided oxide film formed on said silicon substrate; and a gate electrode formed on said silicon nitrided oxide film; wherein nitrogen is distributed only in a vicinity of an interface between said silicon substrate and said silicon nitrided oxide film, and nitrogen atoms each bonded to three silicon atoms exist only in said vicinity of the interface.

4. The semiconductor device according to claim 3, wherein said gate electrode is a floating gate electrode, said semiconductor device further comprising a control gate electrode formed on said floating gate electrode with a dielectric film interposed.

* * * * *

UNITED STATES PATENT AND TRADEMARK OFFICE
CERTIFICATE OF CORRECTION

PATENT NO.   : 6,215,146 B1
DATED        : April 10, 2001
INVENTOR(S)  : Hiroshi Umeda, et al.

It is certified that error appears in the above-identified patent and that said Letters Patent is hereby corrected as shown below:

<u>Title page,</u>
Under (73) Assignee:, change "Kenki" to -- Denki --.

Signed and Sealed this

Fourth Day of September, 2001

*Attest:*

*Nicholas P. Godici*

*Attesting Officer*

NICHOLAS P. GODICI
*Acting Director of the United States Patent and Trademark Office*